US012193156B2

(12) United States Patent
Ikeda et al.

(10) Patent No.: US 12,193,156 B2
(45) Date of Patent: Jan. 7, 2025

(54) WIRING SUBSTRATE AND METHOD FOR MANUFACTURING WIRING SUBSTRATE

(71) Applicant: IBIDEN CO., LTD., Gifu (JP)

(72) Inventors: Tomoyuki Ikeda, Ogaki (JP); Kentaro Wada, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 17 days.

(21) Appl. No.: 17/730,283

(22) Filed: Apr. 27, 2022

(65) Prior Publication Data

US 2022/0369456 A1    Nov. 17, 2022

(30) Foreign Application Priority Data

May 14, 2021    (JP) .................. 2021-082387

(51) Int. Cl.
*H05K 1/11* (2006.01)
*H05K 1/18* (2006.01)
*H05K 3/40* (2006.01)

(52) U.S. Cl.
CPC ............. *H05K 1/112* (2013.01); *H05K 1/183* (2013.01); *H05K 1/185* (2013.01); *H05K 3/4007* (2013.01); *H05K 3/4038* (2013.01); *H05K 1/111* (2013.01); *H05K 2201/096* (2013.01)

(58) Field of Classification Search
CPC .... H05K 1/112; H05K 3/4007; H05K 3/4038; H05K 2201/096; H05K 1/185; H05K 3/384; H01L 23/5383; H01L 23/5384; H01L 23/5389
See application file for complete search history.

(56) References Cited

U.S. PATENT DOCUMENTS

| 2012/0152600 A1* | 6/2012 | Nishioka ............ H05K 3/4007 174/258 |
| 2016/0020163 A1* | 1/2016 | Shimizu ............. H05K 1/115 361/768 |
| 2016/0064319 A1* | 3/2016 | Suzuki ............ H01L 23/49822 174/251 |
| 2016/0233167 A1* | 8/2016 | Shimizu ............... H01L 21/486 |
| 2019/0267327 A1* | 8/2019 | Aoki ................... H01L 21/4857 |
| 2020/0357712 A1* | 11/2020 | Tanaka ............. H01L 23/49827 |

FOREIGN PATENT DOCUMENTS

JP    2018-172759 A    11/2018

* cited by examiner

*Primary Examiner* — Ishwarbhai B Patel
(74) *Attorney, Agent, or Firm* — Oblon, McClelland, Maier & Neustadt, L.L.P.

(57) ABSTRACT

A wiring substrate includes a first insulating layer, a conductor layer formed on the first insulating layer, a second insulating layer formed on the first insulating layer such that the second insulating layer is covering the conductor layer, and a coating film formed on a surface of the conductor layer such that the coating film is adhering the conductor layer and the second insulating layer. The conductor layer includes a conductor pad and a wiring pattern, and the conductor pad of the conductor layer has a mounting surface including a first region and a component mounting region formed such that the second insulating layer has a through hole exposing the component mounting region and that the first region is covered by the second insulating layer and roughened to have a surface roughness higher than a first surface roughness of a surface of the wiring pattern facing the second insulating layer.

20 Claims, 12 Drawing Sheets

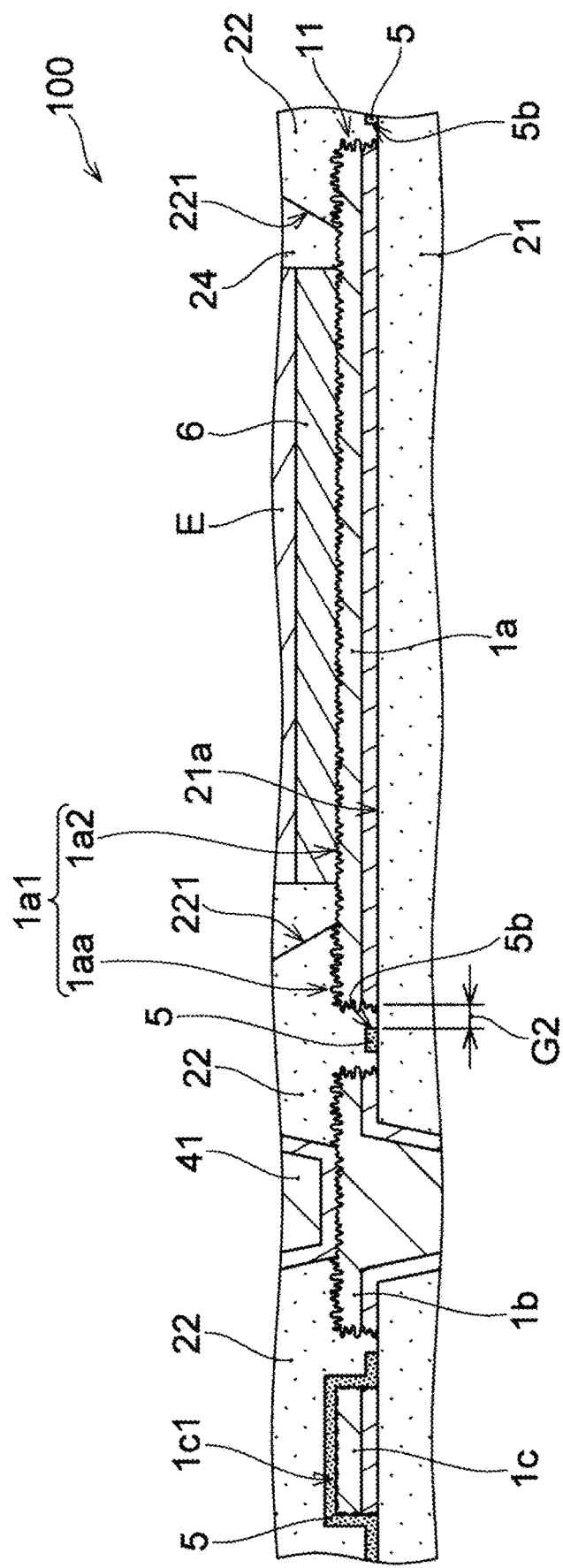

WIRING SUBSTRATE AND METHOD FOR MANUFACTURING WIRING SUBSTRATE

CROSS-REFERENCE TO RELATED APPLICATIONS

The present application is based upon and claims the benefit of priority to Japanese Patent Application No. 2021-082387, filed May 14, 2021, the entire contents of which are incorporated herein by reference.

BACKGROUND OF THE INVENTION

Field of the Invention

The present invention relates to a wiring substrate and a method for manufacturing the wiring substrate.

Description of Background Art

Japanese Patent Application Laid-Open Publication No. 2018-172759 describes a printed wiring board in which a chemical conversion coating film is formed on a low-roughened or non-roughened surface of a metal wiring layer and an insulating resin layer is formed on the metal wiring layer via the chemical conversion coating film. The entire contents of this publication are incorporated herein by reference.

SUMMARY OF THE INVENTION

According to one aspect of the present invention, a wiring substrate includes a first insulating layer, a conductor layer formed on the first insulating layer, a second insulating layer formed on the first insulating layer such that the second insulating layer is covering the conductor layer, and a coating film formed on a surface of the conductor layer such that the coating film is adhering the conductor layer and the second insulating layer. The conductor layer includes a conductor pad and a wiring pattern, and the conductor pad of the conductor layer has a mounting surface including a first region and a component mounting region formed such that the second insulating layer has a through hole exposing the component mounting region and that the first region is covered by the second insulating layer and roughened to have a surface roughness higher than a first surface roughness of a surface of the wiring pattern facing the second insulating layer.

According to another aspect of the present invention, a method for manufacturing a wiring substrate includes forming a conductor layer including a conductor pad and a wiring pattern on a first insulating layer, roughening an exposed surface of the conductor layer formed on the first insulating layer, forming a coating film on at least portion of the exposed surface of the first conductor layer, forming a second insulating layer such that the second insulating layer covers the first conductor layer and the coating film, and forming a through hole in the second insulating layer such that the through hole penetrates through the second insulating layer and exposes a component accommodating part of the conductor pad. The roughening of the exposed surface of the conductor layer includes roughening the exposed surface of the conductor pad without roughening an exposed surface of the wiring pattern of the conductor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4B is a cross-sectional view illustrating an example of a first conductor pad according to yet another embodiment of the present invention;

DETAILED DESCRIPTION OF THE EMBODIMENTS

Figure 1:
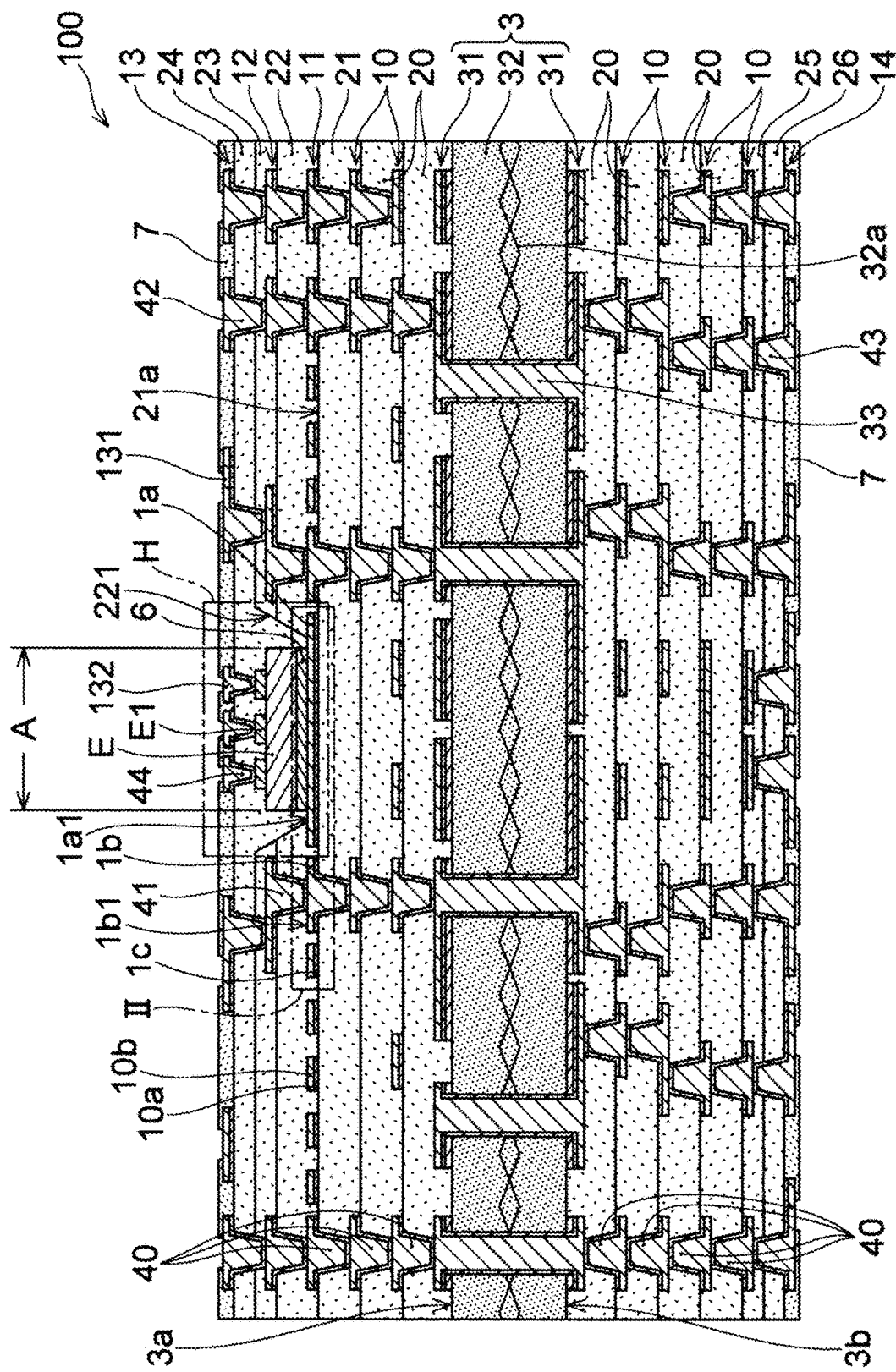
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

First Embodiment

Figure 2:
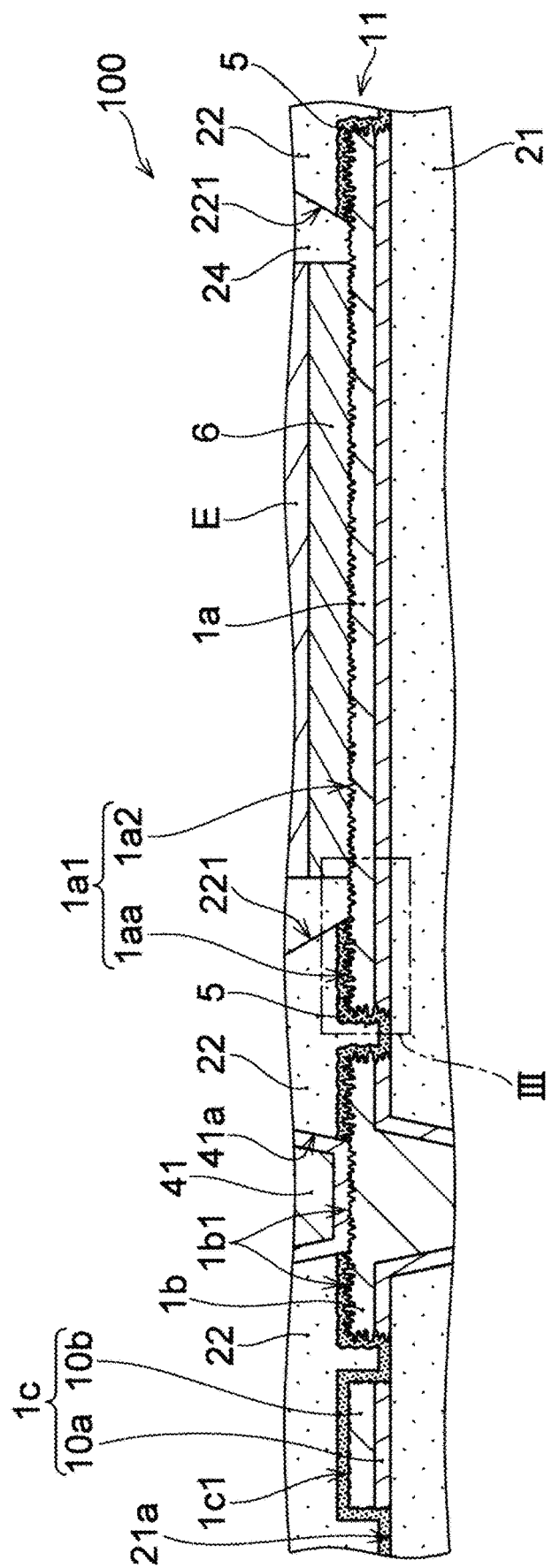
FIG. 2 is an enlarged view of a portion (II) of FIG. 1.
Figure 3:
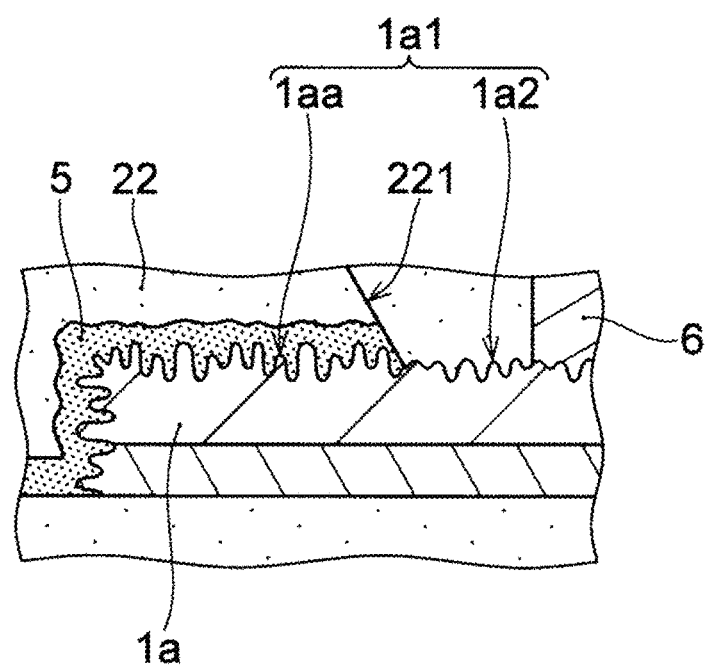
FIG. 3 is an enlarged view of a portion (III) in FIG. 2.

A wiring substrate according to a first embodiment of the present invention is described with reference to the drawings. FIG. 1 is a cross-sectional view illustrating a wiring substrate 100, which is an example of the wiring substrate of the present embodiment. FIG. 2 illustrates an enlarged view of a portion (II) of FIG. 1. Further, FIG. 3 illustrates an enlarged view of a portion (III) of FIG. 2. The wiring substrate 100 is merely an example of the wiring substrate of the present embodiment. A laminated structure, and the number of conductor layers and the number of insulating layers of the wiring substrate of the embodiment are not limited to the laminated structure of the wiring substrate 100 of FIG. 1, and the number of conductor layers and the number of insulating layers included in the wiring substrate 100.

As illustrated in FIG. 1, the wiring substrate 100 includes a core substrate 3, and insulating layers and conductor layers that are alternately laminated on two main surfaces (a first surface (3a) and a second surface (3b)) of the core substrate 3 opposing each other in a thickness direction of the core substrate 3. The core substrate 3 includes an insulating layer 32, and conductor layers 31 that are respectively formed on both sides of the insulating layer 32. The insulating layer 32 includes connection conductors 33 (through-hole conductors) that penetrate the insulating layer 32 and connect the conductor layer 31 on the first surface (3a) side and the conductor layer 31 on the second surface (3b) side.

On the first surface (3a) of the core substrate 3, sequentially from the first surface (3a) side, two insulating layers 20 and two conductor layers 10 are alternatively laminated, and further, an insulating layer 21, a conductor layer 11, an insulating layer 22, a conductor layer 12, an insulating layer 23 (protective layer), an insulating layer 24 (sealing layer), and a conductor layer 13 are laminated in this order. On the other hand, on the second surface (3b) of the core substrate 3, four insulating layers 20 and four conductor layers 10 are alternately laminated, and further, an insulating layer 25 and an insulating layer 26 are laminated, and then, a conductor layer 14 is formed thereon. That is, the wiring substrate 100 includes the insulating layer 21 (first insulating layer), the conductor layer 11 (first conductor layer), the insulating layer 22 (second insulating layer), and the conductor layer 12 (second conductor layer) formed on the insulating layer 22. The conductor layer 11 is formed on a surface (21a) of the insulating layer 21. The insulating layer 22 covers the surface (21a) of the insulating layer 21 and the conductor layer 11.

In the description of the embodiment, a side farther from the insulating layer 32 in a thickness direction of the wiring substrate 100 is also referred to as an "upper side," "outer side," or simply "upper," and a side closer to the insulating layer 32 is also referred to as a "lower side," "inner side," or simply "lower." Further, for the conductor layers and the insulating layers, a surface facing the opposite side with respect to the insulating layer 32 is also referred to as an "upper surface," and a surface facing the insulating layer 32 side is also referred to as a "lower surface."

In each of the insulating layers 20 and the insulating layer 21, connection conductors 40 are formed that penetrate the each of the insulating layers and connect conductor layers that are adjacent to each other via the each of the insulating layers. In the insulating layer 23 and the insulating layer 24, connection conductors 42 connecting the conductor layer 12 and the conductor layer 13 are formed, and in the insulating layer 25 and the insulating layer 26, connection conductors 43 connecting the conductor layer 10 and the conductor layer 14 are formed. Further, the wiring substrate 100 includes connection conductors (first connection conductors) 41 that penetrate the insulating layer 22 and connect the conductor layer 11 and the conductor layer 12. The connection conductors (40-43) are so-called via conductors formed in the insulating layers that are sequentially built up.

The wiring substrate 100 further includes solder resists 7. The solder resists 7 are respectively formed on a surface of the wiring substrate 100 on the first surface (3a) side of the core substrate 3 and on a surface of the wiring substrate 100 on the second surface (3b) side of the core substrate 3. The solder resists 7 have openings that each expose a part of the conductor layer 13 or the conductor layer 14. The solder resist layers 7 are formed, for example, using any insulating material such as an epoxy resin or a polyimide resin.

The insulating layers 20, the insulating layers (21-26), and the insulating layers 32 are each formed of any insulating resin. Examples of the insulating resin include an epoxy resin, a bismaleimide triazine resin (BT resin), a phenol resin, and the like. In the example of FIG. 1, the insulating layer 32 contains a core material (reinforcing material) (32a) formed of a glass fiber, an aramid fiber, or the like. Although not illustrated in FIG. 1, the insulating layers other than the insulating layers 32 can also each contain a core material formed of a glass fiber or the like. The insulating layers (20-26) and the insulating layer 32 each can further contain an inorganic filler (not illustrated in the drawings) formed of fine particles of silica ($SiO_2$), alumina, mullite, or the like.

The conductor layers 10, the conductor layers (11-14), and the conductor layers 31, and the connection conductors 33 and the connection conductors (40-43) are each formed using any metal such as copper or nickel. In the example of FIG. 1, the conductor layers 31 each have, for example, a three-layer structure including a metal foil layer, an electrolytic plating film layer, and a metal coating film layer, the metal coating film layer being sandwiched between the metal foil layer and the electrolytic plating film layer and functioning as a power feeding layer when the electrolytic plating film layer is formed. The connection conductors 33 are integrally formed with the two conductor layers 31, and are formed of the metal coating film layer and the electrolytic plating film layer that form the conductor layers 31. On the other hand, the conductor layers (10-14) and the connection conductors (40-43) are each formed of a metal coating film layer (10a) and an electrolyte plating film layer (10b). Each of the connection conductors (40-43) is integrally formed with a conductor layer (one of the conductor layers (10-14)) formed on an insulating layer that includes the each of the connection conductors (40-43). The metal coating film layer (10a) is, for example, an electroless plating film or a sputtering film, and functions as a power feeding layer when the electrolytic plating film layer (10b) is formed.

The conductor layers (10-14) and the conductor layers 31 each include predetermined conductor patterns. For example, the conductor layer 13 includes connection pads (131, 132) used for connecting to external circuits. And, the conductor layer 11 includes a first conductor pads (1a), second conductor pads (1b), and wiring patterns (1c). The first conductor pad (1a) is a component mounting pad used for mounting a component built or mounted in the wiring substrate 100. Therefore, the first conductor pad (1a) includes a component mounting region (A), which is a region on which a component is to be placed, on a surface (1a1) (a mounting surface of the first conductor pad (1a)) on the opposite side with respect to the insulating layer 21. The second conductor pads (1b) are in contact with the connection conductors 41 penetrating the insulating layer 22. That is, the second conductor pads (1b) are conductor pads on which the connection conductors 41 are formed, and are so-called receiving pads for the connection conductors 41.

Therefore, surfaces (1b1) of the second conductor pads (1b) on the opposite side with respect to the insulating layer 21 (upper surfaces of the second conductor pads (1b)) are partially covered by the connection conductors 41.

The wiring patterns (1c) are conductor patterns that function as conductive paths used for transmission of any electrical signals or supply of electric power. Surfaces of the wiring patterns (1c) other than surfaces facing the insulating layer 21 are covered by the insulating layer 22. The wiring patterns (1c), for example, may independently, or in cooperation with other conductor patterns, connect predetermined transmission source and transmission destination of electrical signals, or may connect predetermined supply source and supply destination of electric power. The wiring patterns (1c) may be, for example, transmission paths for signals of high frequencies exceeding several GHz.

As illustrated in FIG. 1, the insulating layer 22 has a through hole 221. In the example of FIG. 1, the through hole 221 also penetrates the insulating layer 23. The through hole 221 exposes the component mounting region (A) of the first conductor pad (1a) from the insulating layer 22. However, the insulating layer 22 covers a portion of the first conductor pad (1a) other than the component mounting region (A) around the through hole 221. The insulating layer 22 partially covers the first conductor pad (1a). Specifically, the insulating layer 22 covers a peripheral edge part of the first conductor pad (1a). That is, the surface (1a1) of the first conductor pad (1a) includes a first region (1aa), which is a peripheral edge part of the surface (1a1) and is a portion that is not covered by the insulating layer 22, and an exposed part (1a2) exposed from the insulating layer 22.

The first conductor pad (1a) covers an entire region of the surface (21a) of the insulating layer 21 that overlaps the through hole 221, and exposes the component mounting region (A) in the through hole 221. A component accommodating part (recess or cavity) (H) in which a component built in the wiring substrate 100 is accommodated is formed by the through hole 221 and the first conductor pad (1a). An entire bottom surface of the component accommodating part (H) is formed by the surface (1a1) of the first conductor pad (1a) on the opposite side with respect to the insulating layer 21.

In the example of FIG. 1, a component (E) is actually accommodated in the component accommodating part (H). The component (E) is mounted in the component mounting region (A) of the first conductor pad (1a). The component (E) includes electrodes (E1) used for connecting the component (E) to an external circuit. Examples of the component (E) include electronic components such as an active component such as a semiconductor integrated circuit device or a transistor, and a passive component such as an electrical resistor. It is also possible that the component (E) is a wiring material including fine wirings formed on a semiconductor substrate. The component (E) is bonded to the first conductor pad (1a) using an adhesive 6 formed of any material such as a metal (such as solder or gold), a conductive adhesive, or an insulating adhesive formed of an epoxy resin or the like.

The through hole 221 is filled with a material that forms the insulating layer 24. The insulating layer 24 covers the component (E). The component (E) is sealed in the through hole 221 by the insulating layer 24. Therefore, the wiring substrate 100 of FIG. 1 is a wiring substrate with a built-in component. Connection conductors 44 are provided on the component (E). The connection conductors 44 penetrate the insulating layer 24 on the component (E) and connect the electrodes (E1) of the component (E) and the connection pads (132). The connection conductors 44 can be formed using the same material as the connection conductors (40-43) and can have the same structure as the connection conductors (40-43).

Although omitted in FIG. 1, as illustrated in FIGS. 2 and 3, a coating film 5 is formed on a surface of the conductor layer 11 facing the insulating layer 22. That is, the wiring substrate 100 further includes the coating film 5 interposed between the conductor layer 11 and the insulating layer 22. "The surface of the conductor layer 11 facing the insulating layer 22" means a region of the surface of the conductor layer 11 facing the insulating layer 22. Similarly, "surfaces of the wiring patterns (1c) facing the insulating layer 22" to be described later mean regions of the surfaces of the wiring patterns (1c) facing the insulating layer 22. In the example of FIG. 2, the coating film 5 covers substantially the entire surface (21a) of the insulating layer 21 that is not covered by the conductor layer 11.

The coating film 5 improves adhesion between the conductor layer 11 and the insulating layer 22. The coating film 5 is formed of, for example, a material that can bind to both an organic material such as a resin forming the insulating layer 22 and an inorganic material such as a metal forming the conductor layer 11. The coating film 5 is formed of, for example, a material that contains both a reactive group capable of chemically bonding to an organic material and a reactive group capable of chemically bonding to an inorganic material. Therefore, the conductor patterns of the conductor layer 11, which are covered by the coating film 5, and the insulating layer 22 adhere to each other with sufficient strength. An example of a material of the coating film 5 is a silane coupling agent containing an azole silane compound such as a triazole compound. The material of the coating film 5 is not limited to a silane coupling agent as long as the material can increase the adhesion strength between the conductor layer 11 and the insulating layer 22 as compared to a case where the insulating layer 22 is directly formed on the conductor layer 11.

As illustrated in FIG. 2, the wiring patterns (1c) are covered by the coating film 5. Specifically, surfaces (1c1) of the wiring patterns (1c) facing the insulating layer 22 are covered by the coating film 5. In the example of FIGS. 2 and 3, the first region (1aa) of the surface (1a1) and a side surface of the first conductor pad (1a) covered by the insulating layer 22 are also covered by the coating film 5. Further, as illustrated in FIG. 2, a portion of the surface (1b1) and a side surface of each of the second conductor pads (1b) covered by the insulating layer 22 are also covered by the coating film 5. That is, adhesion between the insulating layer 22 and each of the wiring patterns (1c), the first conductor pad (1a) and the second conductor pads (1b) is increased as compared to a case where the coating film 5 is absent. Therefore, it is thought that floating or peeling off of the insulating layer 22 from the wiring patterns (1c), the first conductor pad (1a), and the second conductor pads (1b) is unlikely to occur.

Figure 4A:
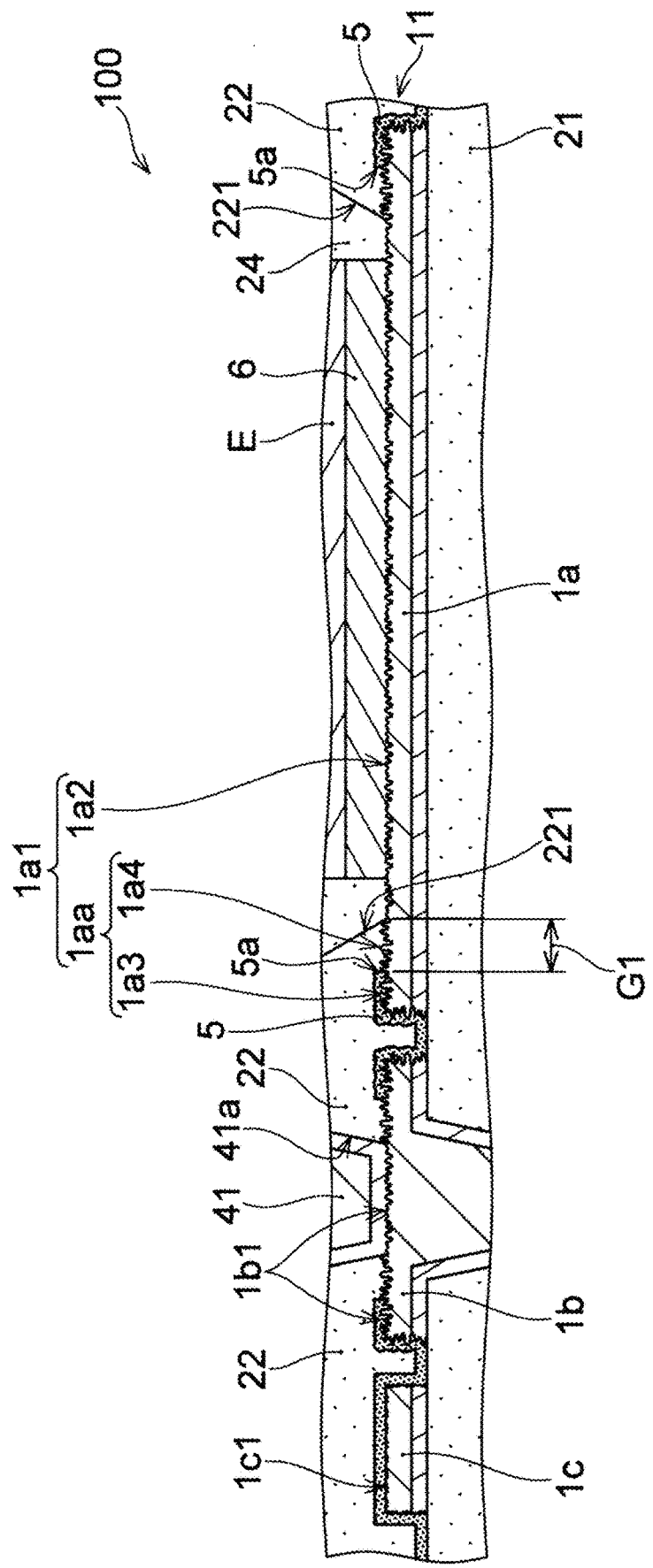
FIG. 4A is a cross-sectional view illustrating an example of a first conductor pad according to another embodiment of the present invention.

As in the example of FIG. 2, entire portions of the surface (1a1) of the first conductor pad (1a) and the surfaces (1b1) of the second conductor pads (1b that are covered by the insulating layer 22) may be covered by the coating film 5. However, as illustrated in FIGS. 4A and 4B to be referenced later, the first region (1aa) of the surface (1a1) of the first conductor pad (1a) that is covered by the insulating layer 22 may be entirely or partially in direct contact with the insulating layer 22 without intervention of the coating film 5. Similarly, the portion of the surface (1b1) of each of the second conductor pads (1b) that is covered by the insulating layer 22 may be partially or entirely in direct contact with the insulating layer 22 without intervention of the coating film 5.

Although omitted in FIG. 1 referenced above, as illustrated in FIG. 2, the surfaces of the conductor patterns (such as the first and second conductor pads (1a, 1b) and the wiring patterns (1c)) of the conductor layer 11 that are not in contact with the insulating layer 21 have unevennesses of mutually different degrees or the same degree. In the example of FIG. 2, a height difference of the unevenness on the surfaces (1c1) of the wiring patterns (1c) is smaller than a height difference of the unevenness on the surface (1a1) of the first conductor pad (1a) and on the surfaces (1b1) of the second conductor pads (1b). The surfaces (1c1) have a relatively low surface roughness (first surface roughness).

That is, the surface (mounting surface) (1a1) of the first conductor pad (1a) includes a region having a surface roughness higher than the first surface roughness of the surfaces (1c1) of the wiring patterns (1c). Further, the surface (upper surface) (1b1) of each of the second conductor pads (1b) includes a region (third region) having a surface roughness higher than the first surface roughness of the surfaces (1c1) of the wiring patterns (1c). In the example of FIG. 2, the entire surface (1a1) of the first conductor pad (1a) has a surface roughness higher than the first surface roughness. Similarly, the entire surface (1b1) of each of the second conductor pads (1b) has a surface roughness higher than the first surface roughness, and the third region occupies the entire surface (1b1). The surface (1a1) (that is, the first region (1aa) and the exposed part (1a2)) and the surface (1b1) (the third region) are roughened to have a surface roughness higher than the first surface roughness. As will be described later, the surface (1a1) of the first conductor pad (1a) and the surfaces (1b1) of the second conductor pads (1b) are roughened, for example, by microetching or the like. On the other hand, the surfaces (1c1) of the wiring patterns (1c) do not have to be roughened by a process that is actively provided for roughening the surfaces (1c1). The unevenness of the surfaces (1c1) may be generated by grain boundaries of the electrolytic plating film layer (10b) or by an unevenness of a surface of a plating resist during the formation of the electrolytic plating film layer (10b).

In the wiring substrate 100, since the surface (1a1) of the first conductor pad (1a) and the surfaces (1b1) of the second conductor pads (1b) have a relatively high surface roughness, it may be possible that peeling between each of the first and second conductor pads (1a, 1b) and the insulating layer 22 is suppressed. Specifically, unintentional infiltration of a liquid into interfaces between the conductor pads and the insulating layer 22 is prevented by the unevenness of the surface (1a1) or the surfaces (1b1) having a relatively high surface roughness. As a result, it may be possible that peeling between each of the first and second conductor pads (1a, 1b) and the insulating layer 22 that can be caused by such infiltration of a liquid is suppressed.

More specifically, in a manufacturing process of the wiring substrate of the embodiment, an inner wall of the through hole 221 and inner walls of through holes (41a) provided in the insulating layer 22 for forming the connection conductors 41 may be exposed to various treatment solutions, plating solutions, or the like. Then, these liquids may infiltrate into the interfaces between the first and second conductor pads (1a, 1b) and the insulating layer 22 from the inner walls of the through hole 221 and the through holes (41a), and cause peeling between the conductor pads and the insulating layer 22. However, in the present embodiment, unintentional infiltration of a liquid that can cause such peeling is prevented by the unevenness of the surfaces of the conductor pads having a relatively high surface roughness.

On the other hand, the surfaces (1c1) of the wiring patterns (1c) have the relatively low first surface roughness. For wiring patterns having a high surface roughness, in transmission of high frequency signals, transmission characteristics may deteriorate due to a substantial increase in impedance. Further, for example, for fine wiring patterns of about (10 μm)/(10 μm) ((wiring width)/(wiring interval)) or less, when their surfaces are highly roughened, it may be possible that desired dimensions cannot be obtained after roughening with respect to designed wiring widths or thicknesses. In contrast, in the present embodiment, the surfaces (1c1) of the wiring patterns (1c) have a relatively low surface roughness, at least a lower surface roughness than the surfaces (1a1, 1b1) of the first and second conductor pads (1a, 1b). Therefore, it is thought that a problem such as deterioration in high frequency transmission characteristics due to a high surface roughness is unlikely to occur.

And, the surfaces (1c1) of the wiring patterns (1c) are covered by the coating film 5 that improves the adhesion between the wiring patterns (1c) and the insulating layer 22. A so-called anchor effect cannot be sufficiently obtained between a conductor layer having a relatively low surface roughness and an insulating layer formed on a surface of the conductor layer, and as a result, peeling between the conductor layer and the insulating layer may occur. However, since the surfaces (1c1) of the wiring patterns (1c) of the present embodiment are covered by the coating film 5, it is thought that peeling between the wiring patterns (1c) and the insulating layer 22 is unlikely to occur.

Further, in the present embodiment, it may be possible that deterioration in quality due to melting of the coating film 5 formed on the surfaces (1a1, 1b1) of the first and second conductor pads (1a, 1b) is prevented by the unevenness of the surface (1a1) or the surfaces (1b1). As described above, in a manufacturing process of the wiring substrate of the embodiment, the inner walls of the through hole 221 and the through holes (41a) can be exposed to various liquids. When a liquid infiltrates into the interfaces between the first and second conductor pads (1a, 1b) and the insulating layer 22, the infiltrated liquid may dissolve the coating film 5. In this case, it is possible that the coating film 5 elutes into the through holes, causing a connection failure between the component (E) or the connection conductors 41 and the conductor pads or causing interfacial peeling at a dissolution site of the coating film 5. However, in the present embodiment, such unintentional infiltration of a liquid that could result in such dissolution of the coating film 5 is prevented by the unevenness of the surfaces (1a1, 1b1) of the first and second conductor pads (1a, 1b) having the relatively high first surface roughness.

In this way, in the wiring substrate 100, good transmission characteristics and sufficient adhesion to the insulating layer 22 are obtained in the wiring patterns (1c), and in addition, deterioration in quality due to peeling between the first and second conductor pads (1a, 1b) and the insulating layer 22 is suppressed. In this way, according to the present embodiment, it may be possible that desired characteristics in the wiring patterns and adhesion between the wiring patterns and the insulating layer can be ensured, and in addition, deterioration in quality of the wiring substrate due to peeling or the like between the conductor pads, which function as component mounting pads, and the insulating layer can be suppressed. In addition, in the example of FIGS. 1-3, it may be possible that deterioration in quality due to peeling or the like between the conductor pads, which are in contact with the connection conductors connecting the conductor layers, and the insulating layer is suppressed.

In order to achieve both good high frequency transmission characteristics in the wiring patterns (1c) and reliable prevention of infiltration of a liquid into the interfaces between the conductor pads and the insulating layer 22, it is thought that a difference between the surface roughness of the surfaces (1a1, 1b1) of the conductor pads and the surface roughness of the surfaces (1c1) of the wiring patterns (1c) is preferably large. The surface roughness of the first region (1aa) of the surface (1a1), and the surface roughness of the portions of the surfaces (1b1) that are covered by the insulating layer 22, are, for example, 0.3 μm or more and 0.6 μm or less in terms of an arithmetic mean roughness (Ra). Further, the first surface roughness of the surfaces (1c1) of the wiring patterns (1c) is, for example, 0.05 μm or more and 0.15 μm or less in terms of an arithmetic mean roughness (Ra). That is, the first region (1aa) of the surface (mounting surface) (1a1) of the first conductor pad (1a), and the portions of the surfaces (upper surfaces) (1b1) of the second conductor pads (1b) that are covered by the insulating layer 22, can have an arithmetic mean roughness (Ra) that is 2 or more times the arithmetic mean roughness (Ra) of the surfaces (1c1) of the wiring patterns (1c).

The surface roughness of the first region (1aa) of the surface (1a1), and the surface roughness of the portions of the surfaces (1b1) that are covered by the insulating layer 22, may be 2 or more times and 12 or less times the first surface roughness. In this case, it is thought that good transmission characteristics for signals of high frequencies of the order of several GHz can be obtained in the wiring patterns (1c) while infiltration of a liquid into the interfaces between the first and second conductor pads (1a, 1b) and the insulating layer 22 is substantially reliably prevented. In addition, it is thought that a roughening process for the surfaces (1a1, 1b1) does not require an excessive time, and damage to the insulating layer 21 and the like during the roughening process is also small. The portions of the surfaces (upper surfaces) (1b1) of the second conductor pads (1b) that are covered by the insulating layer 22 may have substantially the same surface roughness (second surface roughness) as the first region (1aa) of the surface (mounting surface) (1a1) of the first conductor pad (1a). It is thought that the roughening process of the surfaces (1a1, 1b1) is easy.

As illustrated in FIGS. 2 and 3, the unevenness of the exposed part (1a2) of the surface (1a1) of the first conductor pad (1a) that is exposed in the through hole 221 is smaller than the unevenness of the first region (1aa) and is larger than the unevenness of the surfaces (1c1) of the wiring patterns (1c). The exposed part (1a2) is not a surface of a high frequency signal transmission line, and most of the exposed part (1a2) is in contact with the adhesive 6, which has an adherence property, rather than the insulating layers (22, 24). That is, from a point of view of adhesion to the insulating layers or transmission characteristics, neither a high surface roughness nor a low surface roughness is particularly required for the exposed part (1a2). Therefore, the exposed part (1a2) can have any surface roughness (third surface roughness) between the surface roughness (second surface roughness) of the first region (1aa) covered by the insulating layer 22 and the first surface roughness of the surfaces (1c1) of the wiring patterns (1c). Also in the surface (1b1) of the second conductor pad (1b) illustrated in FIG. 2, the surface roughness of the portion that is not covered by the insulating layer 22 may be lower than the surface roughness of the portion that is covered by the insulating layer 22.

Figure 4C:
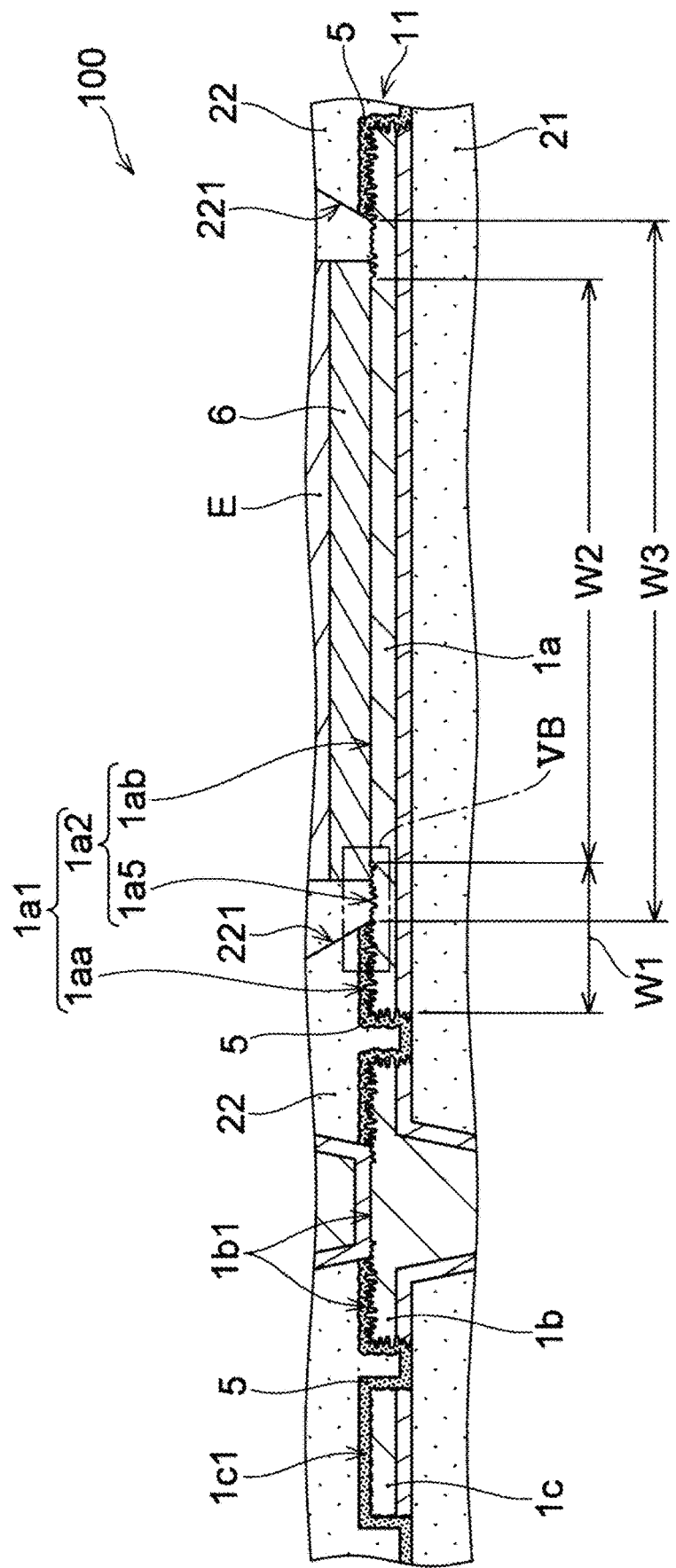
FIG. 4C is a cross-sectional view illustrating an example of a first conductor pad according to yet another embodiment of the present invention.

FIGS. 4A-4C illustrate the conductor patterns (the first conductor pad (1a), the second conductor pads (1b), and the wiring patterns (1c)) of the conductor layer 11 in examples of second-fourth embodiments, respectively. FIGS. 4A-4C illustrate enlarged views of a portion corresponding to the portion (II) of FIG. 1 in the examples of the second-fourth embodiments, respectively. The wiring substrates of the second-fourth embodiments are described with reference to FIGS. 4A-4C. Structures other than the portion illustrated in FIGS. 4A-4C in the examples of the second-fourth embodiments are the same as those of the wiring substrate 100 in the example of FIG. 1. Therefore, description and illustration of structures or structural components of portions other than the portion illustrated in FIGS. 4A-4C are omitted.

Second Embodiment

As illustrated in FIG. 4A, also in the second embodiment, the wiring patterns (1c) are covered by the coating film 5. The surface (mounting surface) (1a1) of the first conductor pad (1a) on the opposite side with respect to the insulating layer 21 includes the first region (1aa) covered by the insulating layer 22, and the first region (1aa) is roughened to have a higher surface roughness than the surface roughness (first surface roughness) of the surfaces (1c1) of the wiring patterns (1c). And, in the present embodiment, the coating film 5 covers a part (peripheral edge part (1a3)) of the first region (1aa) of the surface (1a1) of the first conductor pad (1a). The coating film 5 covers the peripheral edge part (1a3) of the surface (1a1) of the first conductor pad (1a), and an inner peripheral side of the peripheral edge part (1a3) is exposed from the coating film 5. That is, the coating film 5 has an opening (5a), and a non-covered portion (1a4) of the first region (1aa) is exposed in the opening (5a).

The surface (1a1) of the first conductor pad (1a) includes the exposed part (1a2) exposed from the insulating layer 22 by the through hole 221 on a further inner peripheral side of the non-covered portion (1a4) of the first region (1aa). Therefore, an area of the opening (5a) of the coating film 5 is larger than an opening area of the through hole 221 on the surface (1a1). That is, on the surface (1a1) of the first conductor pad (1a), the opening (5a) contains the through hole 221, and the through hole 221 is spaced apart from the coating film 5. The through hole 221 is formed on a region of the surface (1a1) of the first conductor pad (1a) that is not covered by the coating film 5, specifically, on the exposed part (1a2). On the other hand, the non-covered portion (1a4) of the first region (1aa) that is not covered by the coating film 5 is in direct contact with the insulating layer 22. In other words, a part of the insulating layer 22 is interposed between the coating film 5 and the through hole 221.

In the present embodiment, in this way, the through hole 221 and the coating film 5 are spaced apart from each other. Therefore, as described above, in a manufacturing process of the wiring substrate, even when various liquids infiltrate the interface between the first conductor pad (1a) and the insulating layer 22 from the inner wall of the through hole 221, the liquids are unlikely to reach the coating film 5. Therefore, the coating film 5 is unlikely to dissolve. That is, the first conductor pad (1a) and the insulating layer 22 are unlikely to peel off from each other. Further, even when the coating film 5 dissolves, it is difficult for the dissolution solution to elute into the through hole 221. Therefore, a connection failure between the component (E) and the first conductor pad (1a) is unlikely to occur. In this way, in the present embodiment, it is thought that dissolution of the coating film 5 is unlikely to occur, and a problem such as interface peeling or a connection failure or the like caused by the dissolution is prevented.

From a point of view of preventing dissolution of the coating film 5, a gap (G1) between the through hole 221 and the coating film 5 on the surface (1a1) of the first conductor pad (1a) is, for example, 5 μm or more and 20 μm or less. It is thought that, when such a gap is ensured, infiltration of various liquids reaching the coating film 5 during a manufacturing process is prevented, and such a gap does not significantly hinder miniaturization of the wiring substrate of the embodiment.

In the example of FIG. 4A, also for the second conductor pads (1b), a part of the portion of the surface (upper surface) (1b1) that is covered by the insulating layer 22 is covered by the coating film 5. And, the through holes (41a) of the connection conductors 41 are formed on the portions of the surfaces (1b1) of the second conductor pads (1b) that are not covered by the coating film 5, and the connection conductors 41 are spaced apart from the coating film 5. Therefore, it is thought that, also for the second conductor pads (1b), dissolution of the coating film 5 is unlikely to occur, and a problem such as interfacial peeling or a connection failure caused by the dissolution can be prevented.

Third Embodiment

As illustrated in FIG. 4B, also in the third embodiment, the wiring patterns (1c) are covered by the coating film 5. The surface (mounting surface) (1a1) of the first conductor pad (1a) on the opposite side with respect to the insulating layer 21 includes the first region (1aa) covered by the insulating layer 22, and the first region (1aa) is roughened to have a higher surface roughness than the surface roughness (first surface roughness) of the surfaces (1c1) of the wiring patterns (1c). And, in the present embodiment, the first conductor pad (1a) is not covered by the coating film 5. The coating film 5 exposes the entire first conductor pad (1a).

In the example of FIG. 4B, the coating film 5 has an opening (5b), and the first conductor pad (1a) is exposed in the opening (5b). An area of the opening (5b) is larger than an area of the first conductor pad (1a). Therefore, the entire first conductor pad (1a) including its side surface is exposed in the opening (5b) without being covered by the coating film 5. That is, the coating film 5 is spaced apart from the first conductor pad (1a).

In the present embodiment, in this way, the first conductor pad (1a) is not covered by the coating film 5, and the coating film 5 and the first conductor pad (1a) are spaced apart from each other. Therefore, as described above, in a manufacturing process of the wiring substrate, even when various liquids infiltrate the interface between the first conductor pad (1a) and the insulating layer 22 from the inner wall of the through hole 221, the liquids are unlikely to reach the coating film 5. Therefore, the coating film 5 is unlikely to dissolve. That is, the first conductor pad (1a) and the insulating layer 22 are unlikely to peel off from each other. Further, even when the coating film 5 dissolves, it is difficult for the dissolution solution to elute into the through hole 221. Therefore, a connection failure between the component (E) and the first conductor pad (1a) is unlikely to occur. In this way, in the present embodiment, it is thought that dissolution of the coating film 5 is unlikely to occur, and a problem such as interface peeling or a connection failure or the like caused by the dissolution is prevented.

As illustrated in FIG. 4B, the surface (21a) of the insulating layer 21 has a region that is not covered by the coating film 5 around the first conductor pad (1a). The surface (21a) of the insulating layer 21 is in direct contact with the insulating layer 22 in the region that is not covered by the coating film 5. That is, a part of the insulating layer 22 is interposed between the coating film 5 and the first conductor pad (1a). A length of the part of the insulating layer 22 interposed between the coating film 5 and the first conductor pad (1a), that is, a gap (G2) between the first conductor pad (1a) and the coating film 5 on the surface (21a) of the insulating layer 21, is, for example, 5 μm or more and 20 μm or less. It is thought that, when such a length is ensured, even when the through hole 221 having substantially the same opening area as the surface (1a1) of the first conductor pad (1a) is formed, infiltration of a liquid reaching the coating film 5 from the through hole 221 can be prevented with a high probability. In addition, it is thought that such a gap does not significantly hinder miniaturization of the wiring substrate of the embodiment.

In the example of FIG. 4B, the second conductor pads (1b) are also not covered by the coating film 5, and are spaced apart from the coating film 5. Therefore, it is thought that, also for the second conductor pads (1b), dissolution of the coating film 5 is unlikely to occur, and a problem such as interfacial peeling or a connection failure with respect to the connection conductors 41 caused by the dissolution can be prevented.

Fourth Embodiment

Figure 5A:
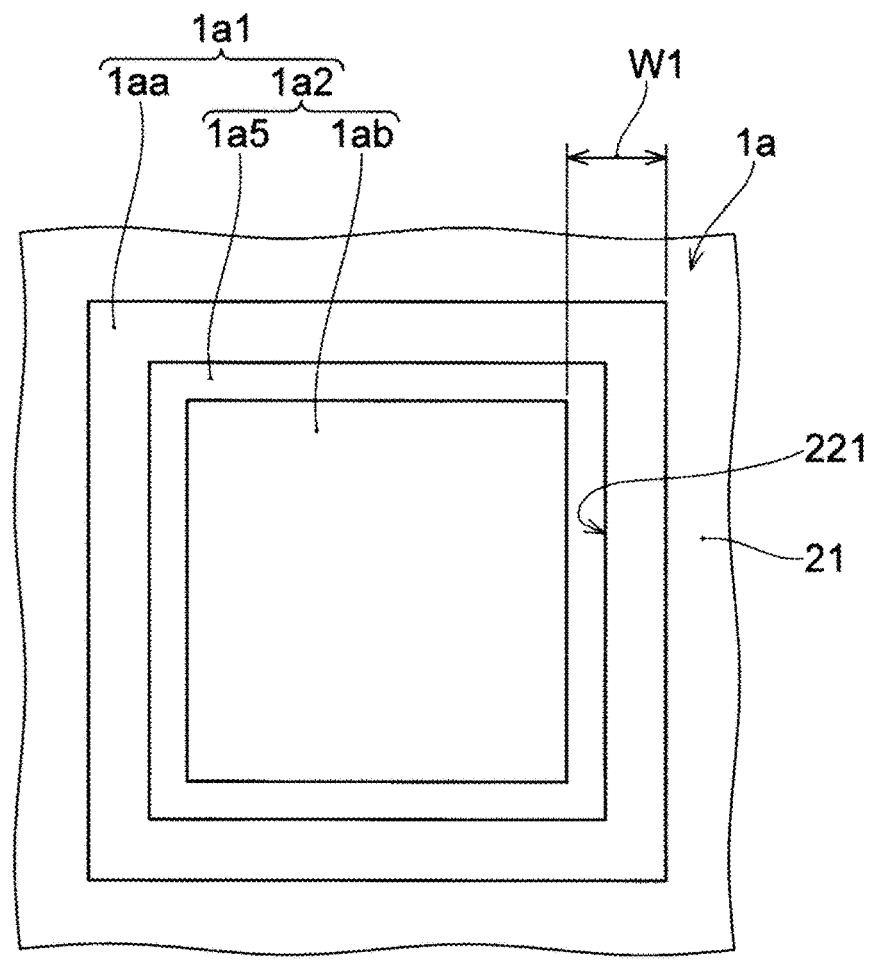
FIG. 5A is a plan view of the first conductor pad of FIG. 4C.
Figure 5B:
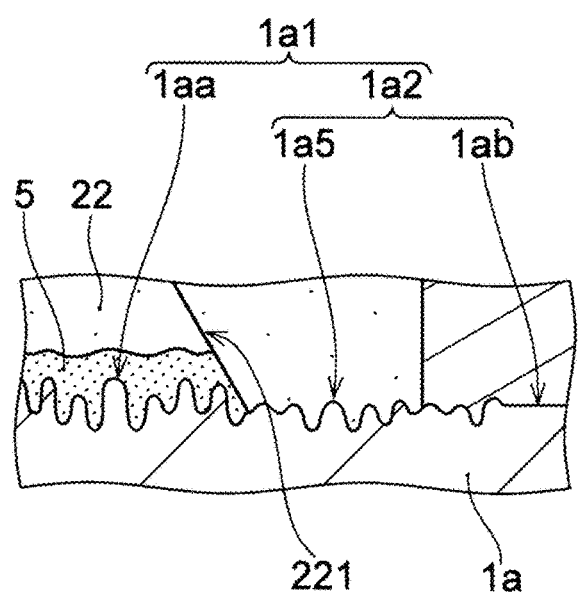
FIG. 5B is an enlarged view of a portion (VB) of FIG. 4C.

As illustrated in FIG. 4C, also in the fourth embodiment, the wiring patterns (1c) are covered by the coating film 5. The surface (mounting surface) (1a1) of the first conductor pad (1a) on the opposite side with respect to the insulating layer 21 includes the first region (1aa) covered by the insulating layer 22, and the first region (1aa) is roughened to have a higher surface roughness than the surface roughness (first surface roughness) of the surfaces (1c1) of the wiring patterns (1c). And, in the present embodiment, the surface (1a1) of the first conductor pad (1a) further includes a second region (1ab) having a surface roughness that is substantially the same as or lower than the first surface roughness. The fourth embodiment is described with reference to FIGS. 5A and 5B together with FIG. 4C. FIG. 5A illustrates an example of a plan view of the first conductor pad (1a) illustrated in FIG. 4C, and FIG. 5B illustrates an enlarged view of a portion (VB) of FIG. 4C.

As illustrated in FIG. 4C, a height difference of unevenness in a region on an outer side of a center part of the surface (1a1) of the first conductor pad (1a) is larger than the height difference of the unevenness of the surfaces (1c1) of the wiring patterns (1c). And, a portion on an outer peripheral side of the portion that has a larger surface roughness than the surfaces (1c1) is covered by the insulating layer 22. That is, as illustrated in FIGS. 4C and 5A, the surface (1a1) of the first conductor pad (1a) has the first region (1aa) in a peripheral edge part thereof. And, the surface (1a1) includes, on an inner side of the first region (1aa), the second region (1ab) having a lower surface roughness than the first surface roughness of the surfaces (1c1) of the wiring patterns (1c). The second region (1ab) is included in the exposed part (1a2) of the surface (1a1) that is not covered by the insulating layer 22. The first region (1aa) has a relatively high surface roughness, and the second region (1ab) has a relatively low surface roughness. The second region (1ab) does not have to be roughened in a process that is actively provided for the second region (1*ab*). The unevenness of the second region (1*ab*) may be generated by grain boundaries of an electrolytic plating film forming the conductor layer 11, or by an unevenness of a surface of a plating resist during the formation of the conductor layer 11.

In the surface (1*a*1) of the first conductor pad (1*a*), the second region (1*ab*) is surrounded by the first region (1*aa*). The first region (1*aa*) surrounds the second region (1*ab*) over an entire circumference thereof. A roughened region (1*a*5) of the exposed part (1*a*2) is interposed between the first region (1*aa*) and the second region (1*ab*). The roughened region (1*a*5) is roughened to have a surface roughness higher than the surface roughness of the surfaces (1*c*1) of the wiring patterns (1*c*) and is exposed from the insulating layer 22. In the surface (1*a*1) of the first conductor pad (1*a*), the first region (1*aa*) and the roughened region (1*a*5), which are both roughened and have relatively high surface roughness, are interposed between the second region (1*ab*) and an outer edge of the first conductor pad (1*a*).

In the surface (1*a*1) of the first conductor pad (1*a*), the roughened region (1*a*5) of the exposed part (1*a*2) is positioned on an inner side of the first region (1*aa*) and is adjacent to the second region (1*ab*). On the other hand, the first region (1*aa*) surrounds the roughened region (1*a*5) and further surrounds the through hole 221 in a plan view. The first region (1*aa*) surrounds the roughened region (1*a*5) and through hole 221 over the entire circumference thereof. The term "plan view" means viewing the wiring substrate of the embodiment along the thickness direction thereof. Portions of the surface (1*a*1) of the first conductor pad (1*a*) other than the first region (1*aa*) are positioned inside the through hole 221. Therefore, the through hole 221 exposes the entire second region (1*ab*) and the entire roughened region (1*a*5) of the first conductor pad (1*a*). In the example of FIGS. 4C and 5A, the first region (1*aa*) has a surface roughness (second surface roughness) higher than the surface roughness of the roughened region (1*a*5) of the exposed part (1*a*2).

In this way, in the present embodiment, in the surface (1*a*1) of the first conductor pad (1*a*), the first region (1*aa*) having a relatively high surface roughness (second surface roughness) is interposed between the through hole 221 and the outer edge of the first conductor pad (1*a*). Therefore, similar to the first-third embodiments, it is thought that peeling between the first conductor pad (1*a*) and the insulating layer 22 that can be caused by unintentional infiltration of a liquid into the interface between the first conductor pad (1*a*) and the insulating layer 22 is suppressed.

In addition, in the present embodiment, the surface (1*a*1) of the first conductor pad (1*a*) has the second region (1*ab*) having a relatively low surface roughness on an inner side of the first region (1*aa*) and the roughened region (1*a*5), which are both roughened. Therefore, it is thought that peeling between the insulating layer 22 and the first conductor pad (1*a*) is more unlikely to occur. More specifically, the surface (1*a*1) of the first conductor pad (1*a*) has an emissivity according to its surface roughness, and the higher the surface roughness, the higher the emissivity can be. Therefore, when the surface (1*a*1) has a higher surface roughness, the surface (1*a*1) can absorb more heat from electromagnetic waves such as light, and as a result, the temperature of the first conductor pad (1*a*) rises. On the other hand, as will be described later, the through hole 221 can be formed, for example, by laser irradiation. Laser is irradiated to at least a center part of the surface (1*a*1) of the first conductor pad (1*a*). Therefore, when the entire surface (1*a*1) has a relatively high surface roughness such as that of the first region (1*aa*), the temperature of the first conductor pad (1*a*) is likely to rise. As a result, due to differences in thermal expansion coefficient between the coating film 5 and the first conductor pad (1*a*) and the insulating layer 22, interfacial peeling may occur between the first conductor pad (1*a*) and the insulating layer 22.

However, in the present embodiment, the surface (1*a*1) of the first conductor pad (1*a*) includes the second region (1*ab*) having a relatively low surface roughness on an inner side of the first region (1*aa*) having a relatively high second surface roughness. Therefore, even when an electromagnetic wave such as laser is irradiated toward the first conductor pad (1*a*) for the formation of the through hole 221, as compared to a case where the entire surface (1*a*1) has the same surface roughness as the surface roughness of the first region (1*aa*), the temperature is unlikely to rise. Therefore, it is thought that peeling between the insulating layer 22 and the first conductor pad (1*a*) is more unlikely to occur. In the example of FIG. 4C, the surfaces (upper surfaces) (1*b*1) of the second conductor pads (1*b*) also each include a region having a surface roughness that is substantially the same as or lower than the first surface roughness. Therefore, it is thought that peeling between the insulating layer 22 and the second conductor pads (1*b*) is more unlikely to occur.

In order to achieve both the suppression of a temperature rise in the first conductor pad (1*a*) and the prevention of infiltration of a liquid into the interface between the first conductor pad (1*a*) and the insulating layer 22, it is thought that a difference in surface roughness between the first region (1*aa*) and the second region (1*ab*) is preferably large. The second region (1*ab*) has a surface roughness equal to or less than the first surface roughness of the surfaces (1*c*1) of the wiring patterns (1*c*). For example, the second surface roughness of the first region (1*aa*) is 0.3 µm or more and 0.6 µm or less in terms of an arithmetic mean roughness (Ra). On the other hand, as described above, the first surface roughness of the surfaces (1*c*1) of the wiring patterns (1*c*) is, for example, 0.05 µm or more and 0.15 µm or less in terms of an arithmetic mean roughness (Ra). That is, the first region (1*aa*) can have an arithmetic mean roughness (Ra) that is 2 or more times the arithmetic mean roughness (Ra) of the surfaces (1*c*1) of the wiring patterns (1*c*). For example, the surface roughness of the first region (1*aa*) may be 2 or more times and 12 or less times the first surface roughness. In this case, it is thought that good transmission characteristics for signals of high frequencies of the order of several GHz can be obtained in the wiring patterns (1*c*) while infiltration of a liquid into the interface between the first conductor pad (1*a*) and the insulating layer 22 is substantially reliably prevented. In addition, it is thought that a roughening process for the surface (1*a*1) does not require an excessive time, and damage to the insulating layer 21 and the like during the roughening process is also small.

A size of the second region (1*ab*) is selected such that a temperature rise in the first conductor pad (1*a*) can be suppressed. A width (W2) of the second region (1*ab*) is, for example, 70% or more, preferably 80% or more of an opening width (W3) of the through hole 221 on the surface (1*a*1) of the first conductor pad (1*a*). When the second region (1*ab*) has the width (W2) of about this ratio, peeling between the first conductor pad (1*a*) and the insulating layer 22 due to a temperature rise in the first conductor pad (1*a*) during the formation of the through hole 221 is likely to be suppressed. The "width" of the second region (1*ab*) and the "opening width" of the through hole 221 are each a longest distance between any two points on an outer circumference in a plan view of the second region (1*ab*) or the through hole 221. The second region (1ab) and the through hole 221 can each have any planar shape. For example, when the second region (1ab) has a rectangular planar shape, the width of the second region (1ab) is a length of a diagonal line in the planar shape of the second region (1ab).

Different from the example of FIG. 4C, the width (W2) of the second region (1ab) may be larger than the width (W3) of the through hole 221. That is, an area of the second region (1ab) may be larger than the opening area of the through hole 221 on the surface (1a1) of the first conductor pad (1a). Even when a formation position of the through hole 221 varies to some extent, the through hole 221 can be formed to entirely fit in the second region (1ab) in a plan view. In this case, the width (W2) of the second region (1ab) is, for example, 130% or less, preferably 120% or less of the opening width (W3) of the through hole 221. It is thought that the first conductor pad (1a) is unlikely to become too large to affect a size of the wiring substrate of the embodiment. In this case, the coating film 5 may have an opening large enough to contain the second region (1ab). It may be possible that unintentional infiltration of a liquid into the interface between the first conductor pad (1a) and the insulating layer 22 is suppressed.

A moderate gap (W1) is provided between the second region (1ab) and the outer edge of the first conductor pad (1a). As described above, even when unintentional infiltration of a liquid into the interface between the first conductor pad (1a) and the insulating layer 22 occurs, the liquid is likely to be retained on the surface (1a1) due to the large unevenness of the first region (1aa). It may be possible to prevent extension of interfacial peeling to the side surface of the first conductor pad (1a). In addition, it is thought that the first conductor pad (1a) is unlikely to become too large to affect the size of the wiring substrate of the embodiment.

In the example of FIG. 4C, as illustrated in FIGS. 4C and 5B, the second region (1ab) of the first conductor pad (1a) includes a portion having a surface roughness lower than the first surface roughness of the surfaces (1c1) of the wiring patterns (1c). In the example of FIGS. 4C and 5B, the entire second region (1ab) has a surface roughness lower than the first surface roughness. In FIGS. 4C and 5B, the second region (1ab) is drawn flat to show a difference in surface roughness from the surfaces (1c1) of the wiring patterns (1c). However, the second region (1ab) does not have to be a flat surface and can have an unevenness corresponding to any surface roughness equal to or lower than the first surface roughness. Further, in the present embodiment, the entire second region (1ab) may have substantially the same surface roughness as the surface roughness (first surface roughness) of the surfaces (1c1) of the wiring patterns (1c). Further, in the present embodiment, in the second region (1ab), a portion having substantially the same surface roughness as the first surface roughness and a portion having a surface roughness lower than the first surface roughness may be mixed.

Next, a method for manufacturing the wiring substrate of the embodiment is described with reference to FIGS. 6A-6J using the wiring substrate 100 of FIG. 1 as an example.

Figure 6A:
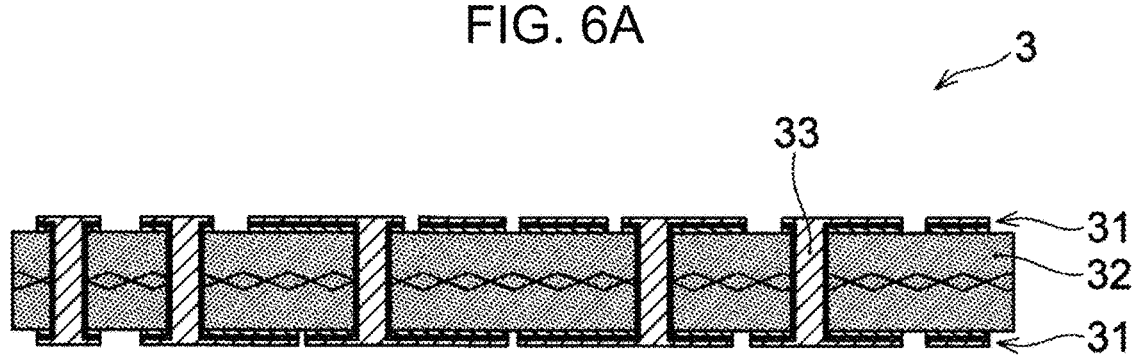
FIG. 6A is a cross-sectional view illustrating an example of a method for manufacturing a wiring substrate according to an embodiment of the present invention.

As illustrated in FIG. 6A, the core substrate 3 is formed. For example, a starting substrate (for example, a double-sided copper-clad laminated plate) is prepared that includes an insulating layer, which is to become the insulating layer 32 of the core substrate 3, and metal foils that are respectively laminated on both sides of the insulating layer. Then, by patterning using a subtractive method following through hole formation and panel plating, the conductor layers 31 having desired conductor patterns and the connection conductors 33 are formed.

Figure 6B:
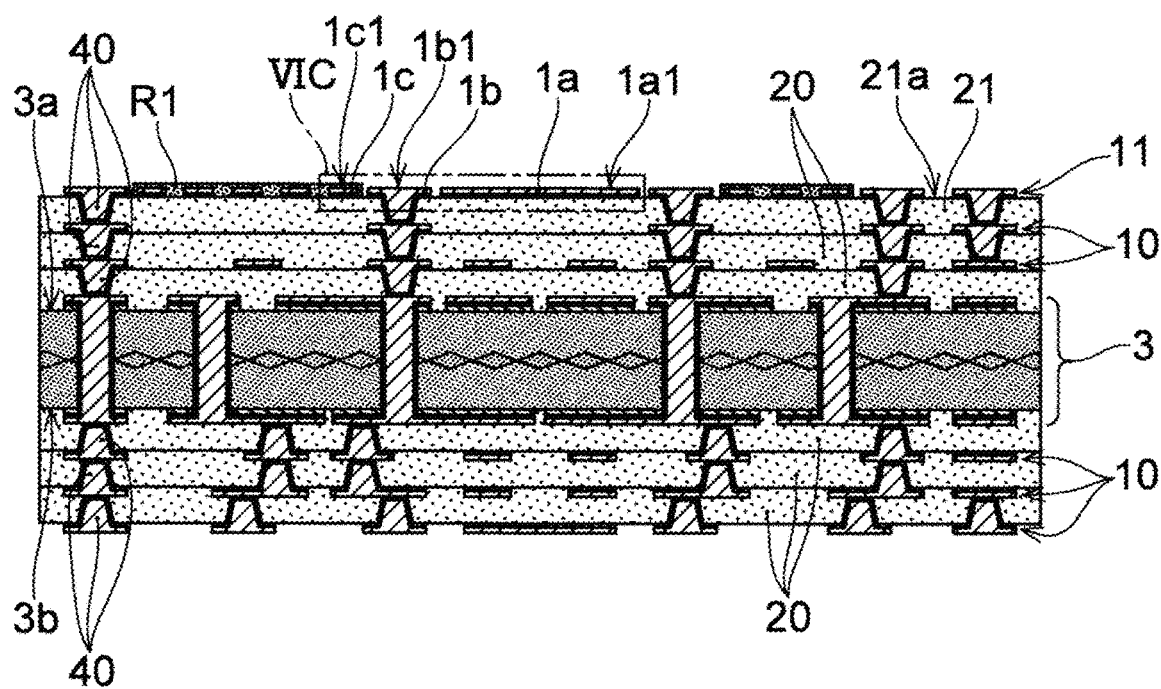
FIG. 6B is a cross-sectional view illustrating an example of a method for manufacturing a wiring substrate according to an embodiment of the present invention.

As illustrated in FIG. 6B, the insulating layers 20 and the conductor layers 10 are alternately formed on the first surface (3a) and the second surface (3b) of the core substrate 3. After two insulating layers 20 and two conductor layers 10 are formed on the first surface (3a) and on the second surface (3b), the insulating layer 21 (first insulating layer) is further formed on the first surface (3a) side, and an insulating layer 20 is further formed on the second surface (3b) side.

In the formation of each of the insulating layers 20 and the insulating layer 21, for example, a film-like epoxy resin is laminated on the core substrate 3 or on an insulating layer 20 and a conductor layer 10 that are formed earlier, and is heated and pressed. As a result, the insulating layer 21 or each of the insulating layers 20 is formed. In the insulating layers 21 and the insulating layers 20, the through holes for forming the connection conductors 40 are formed, for example, by irradiation of $CO_2$ laser.

The conductor layers 10 are each formed, for example, using a semi-additive method. That is, a metal film is formed by electroless plating or sputtering on an entire surface of an insulating layer 20, which is a base of a conductor layer 10, and in the through holes formed in the insulating layer 20. A plating film is formed by pattern plating including electrolytic plating using the metal film as a power feeding layer. The connection conductors 40 are formed in the through holes formed in insulating layers 20. After that, unwanted portions of the metal film are removed, for example, by etching. As a result, the conductor layers 10 each having a two-layer structure including predetermined conductor patterns are formed. The conductor layers 10 are each formed using any metal such as copper or nickel.

As illustrated in FIG. 6B, the conductor layer 11 (first conductor layer) including at least the first conductor pad (1a) and the wiring patterns (1c) is formed on the surface (21a) of the insulating layer 21. In the example of FIG. 6B, the conductor layer 11 is formed so as to include the second conductor pads (1b). On the second surface (3b) side of the core substrate 3, a conductor layer 10 is further formed. The conductor layer 11 is formed, for example, using a semi-additive method, similar to the method for forming the conductor layers 10 described above. In pattern plating during the formation of the conductor layer 11, a plating resist having at least openings corresponding to the first and second conductor pads (1a, 1b) and the wiring patterns (1c) is used.

In the method for manufacturing the wiring substrate of the present embodiment, the exposed surface of the conductor layer 11, that is, the side surface and the upper surface of the surface of each of the conductor patterns of the conductor layer 11 that are not in contact with the insulating layer 21 are roughened. In the roughening of the exposed surface of the conductor layer 11, at least the exposed surface of the first conductor pad (1a), that is, the surface (mounting surface) (1a1) of the conductor pad (1a) on the opposite side with respect to the insulating layer 21 and the side surface of the conductor pad (1a) are roughened. In the example of FIG. 6B, the exposed surfaces of the second conductor pads (1b), that is, the surfaces (upper surfaces) (1b1) of the second conductor pads (1b) on the opposite side with respect to the insulating layer 21 and the side surfaces of the second conductor pads (1b) are also roughened together with the exposed surface in the first conductor pad (1a). However, the exposed surfaces (surfaces (1c1)) of the wiring patterns (1c)

are not roughened. Therefore, in the example of FIG. 6B, a resist film (R1) that covers the wiring patterns (1c) is provided.

Figure 6C:
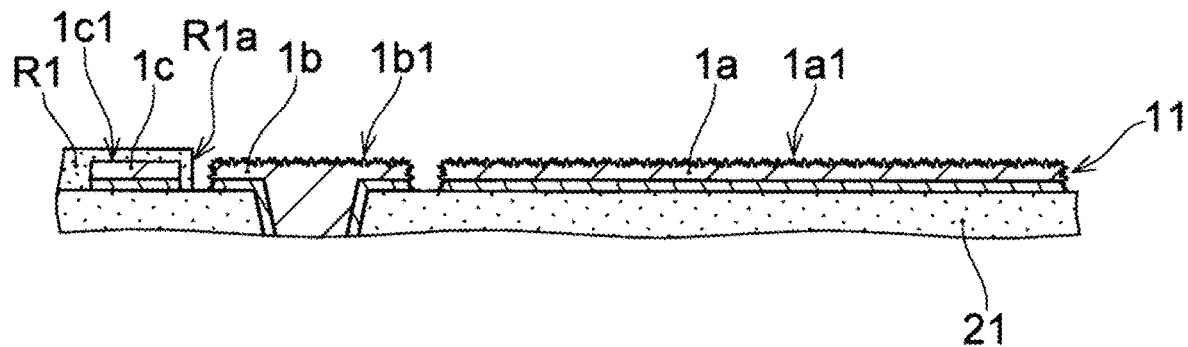
FIG. 6C is a cross-sectional view illustrating an example of a method for manufacturing a wiring substrate according to an embodiment of the present invention.

FIG. 6C illustrates an enlarged view of the exposed surface of the conductor layer 11 in a portion (VIC) of FIG. 6B after a roughening treatment. The resist film (R1) is formed, for example, by laminating a film containing a photosensitive resin. Openings (R1a) exposing the first conductor pad (1a) and the like are provided in the resist film (R1) using a photolithography technology. The resist film (R1) may be formed of the same material as that of the plating resist (not illustrated in the drawings) used in the formation of the conductor layers.

The roughening of the exposed surface of the conductor layer 11 can be performed using any method. For example, the portion of the exposed surface of the conductor layer 11 that is not covered by the resist film (R1) is roughened by a surface oxidation treatment called a blackening treatment or a browning treatment or by a micro-etching treatment using an acidic solvent. Exposed surfaces such as the surface (1a1) of the first conductor pad (1a) and the surfaces (1b1) of the second conductor pads (1b) are roughened to have at least a surface roughness higher than the surface roughness (first surface roughness) of the unroughened surfaces (1c1) of the wiring patterns (1c). The exposed surfaces of the first and second conductor pads (1a, 1b) are roughened, for example, to have a surface roughness of 0.3 μm or more and 0.6 μm or less in terms of an arithmetic mean roughness (Ra).

Figure 6D:
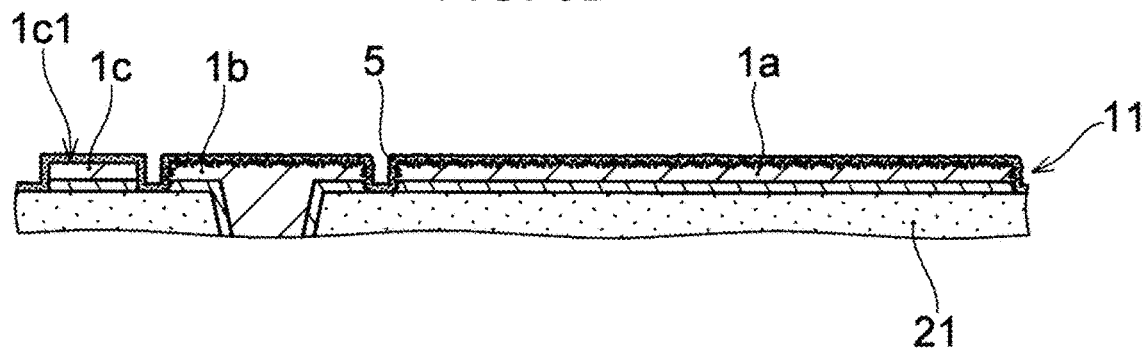
FIG. 6D is a cross-sectional view illustrating an example of a method for manufacturing a wiring substrate according to an embodiment of the present invention.

As illustrated in FIG. 6D, in the method for manufacturing the wiring substrate of the present embodiment, the coating film 5 is provided on the exposed surface of the conductor layer 11. FIG. 6D illustrates a state after the formation of the coating film 5 for the same portion as FIG. 6C. The coating film 5 is provided so as to cover at least the wiring patterns (1c). In the example of FIG. 6D, the coating film 5 is provided on the entire exposed surface of the conductor layer 11 including the exposed surface of the first conductor pad (1a), the exposed surfaces of the second conductor pads (1b), and the exposed surfaces of the wiring patterns (1c). In the present embodiment, as will be described later, it is also possible that the coating film 5 is provided on a part of the exposed surface of the conductor layer 11 including the surfaces (1c1) of the wiring patterns (1c).

The coating film 5 improves the adhesion between the insulating layer 22 (see FIG. 6E), which is formed in a subsequent process, and the conductor layer 11. The coating film 5 is formed, for example, by immersion of the conductor layer 11 in a liquid containing a material such as a silane coupling agent that can bind to both an organic material and inorganic material, or by spraying of such a liquid. However, a method for forming the coating film 5 is arbitrary, and is not limited to immersion or spraying.

Figure 6E:
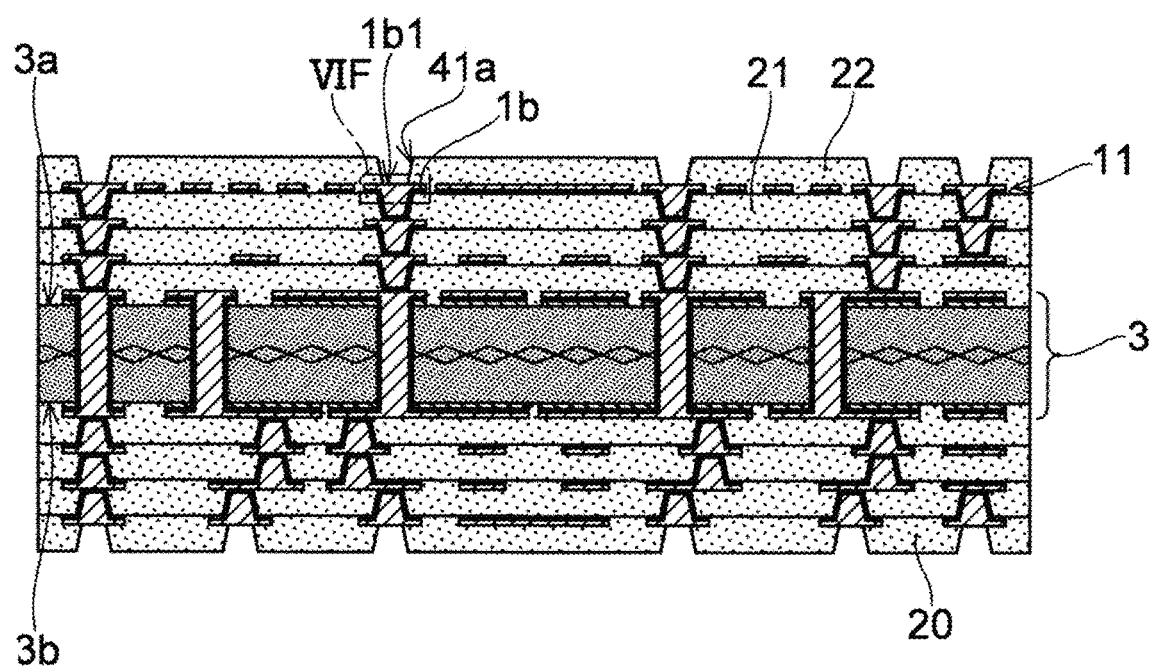
FIG. 6E is a cross-sectional view illustrating an example of a method for manufacturing a wiring substrate according to an embodiment of the present invention.
Figure 6F:
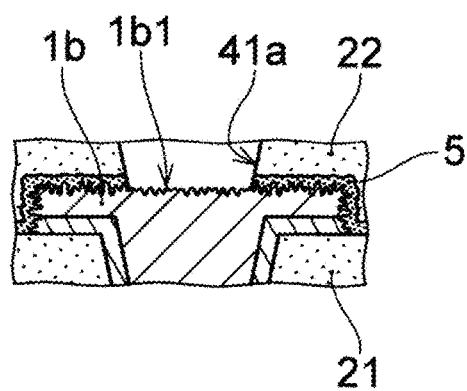
FIG. 6F is a cross-sectional view illustrating an example of a method for manufacturing a wiring substrate according to an embodiment of the present invention.

As illustrated in FIGS. 6E and 6F, the insulating layer 22 (second insulating layer) that covers the conductor layer 11 and the coating film 5 is formed. An insulating layer 20 is further formed on the second surface (3b) side of the core substrate 3. FIG. 6F illustrates an enlarged view of a portion (VIF) of FIG. 6E. Similar to the insulating layer 21, the insulating layer 22 and the further formed insulating layer 20 are each formed, for example, by laminating a film-like epoxy resin and applying heat and pressure thereto. In the insulating layer 22, the through holes (41a) for forming the connection conductors 41 (see FIG. 6G) in a subsequent process are formed, for example, by irradiation of $CO_2$ laser or the like. The through holes (41a) are formed in regions on the second conductor pads (1b) in the insulating layer 22. The surfaces (1b1) of the second conductor pads (1b) are partially exposed by the through holes (41a). Through holes are also formed in the outermost insulating layer 20 on the second surface (3b) side of the core substrate 3.

In the example of FIG. 6F, the coating film 5 formed on the surfaces (1b1) of the second conductor pads (1b) exposed in the through holes (41a) due to the formation of the through holes (41a) is removed by melting and vaporization. By removing the coating film 5 from the surfaces (1b1), the connection conductors, which are formed on the second conductor pads (1b) in a subsequent process, and the second conductor pads (1b) can be bonded firmly with metal-to-metal bonding and with a small electrical resistance. Infiltration of a melting solution of the coating film 5 during the removal of the coating film 5 into the interfaces between the second conductor pads (1b) and the insulating layer 22 is prevented by the unevenness of the surfaces (1b1) of the second conductor pads (1b), which are roughened to have a relatively high surface roughness as described above.

After the formation of the through holes (41a), a desmear treatment is preferably performed. For example, smears in the through holes (41a) are removed by exposing the inner walls of the through holes (41a) to a treatment liquid such as an alkaline permanganate solution. Infiltration of the processing liquid for the desmear treatment into the interfaces between the second conductor pads (1b) and the insulating layer 22 is prevented by the unevenness of the roughened surfaces (1b1) of the second conductor pads (1b). After that, preferably, a soft etching process is performed prior to the formation of the conductor layer 12 and the connection conductors 4 (see FIG. 6G) in a subsequent process. By the soft etching process, an oxide film on portions of the surfaces (1b1) of the second conductor pads (1b) exposed in the through holes (41a) is removed. Further, by the soft etching process, as illustrated in FIG. 6F, the surface roughness of the portions of the surfaces (1b1) exposed in the through holes (41a) is reduced to a surface roughness (third surface roughness) equal to or lower than the surface roughness (second surface roughness) of the portions of the surfaces (1b1) covered by the insulating layer 22.

Figure 6G:
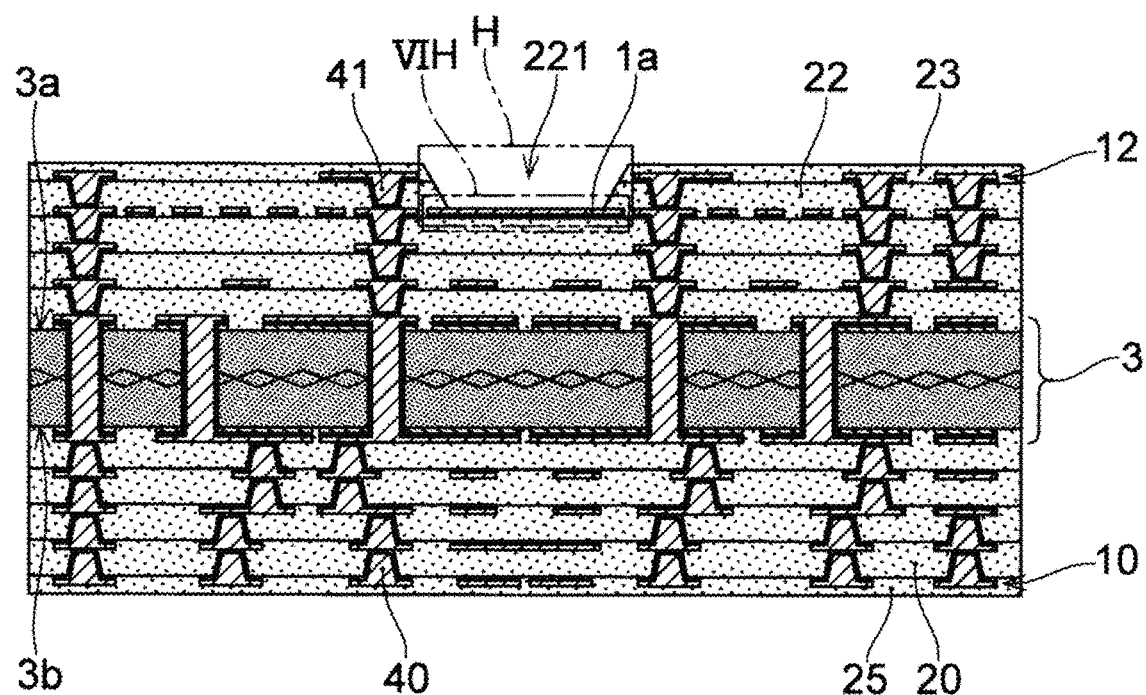
FIG. 6G is a cross-sectional view illustrating an example of a method for manufacturing a wiring substrate according to an embodiment of the present invention.

As illustrated in FIG. 6G, the conductor layer 12 (second conductor layer) is formed on the insulating layer 22. Further, the connection conductors 41 that penetrate the insulating layer 22 and connect the conductor layer 11 and the conductor layer 12 are formed. In the example of FIG. 6G, further, the insulating layer 23 (protective layer) that covers the insulating layer 22 and the conductor layer 12 is formed. Also on the second surface (3b) side of the core substrate 3, similarly, further from the state of FIG. 6E, the conductor layer 10, the connection conductors 40 penetrating the insulating layer 20, and the insulating layer 25 covering these are formed. The insulating layer 23 and the insulating layer 25 can be formed using the same method as the method for forming the insulating layers 20 described above. The conductor layer 12, the connection conductors 41, and the conductor layer 10 and the connection conductors 40 that are further formed on the second surface (3b) side can be formed using the method for forming the conductor layers 10 and the connection conductors 40 described above, for example, a semi-additive method.

Figure 6H:
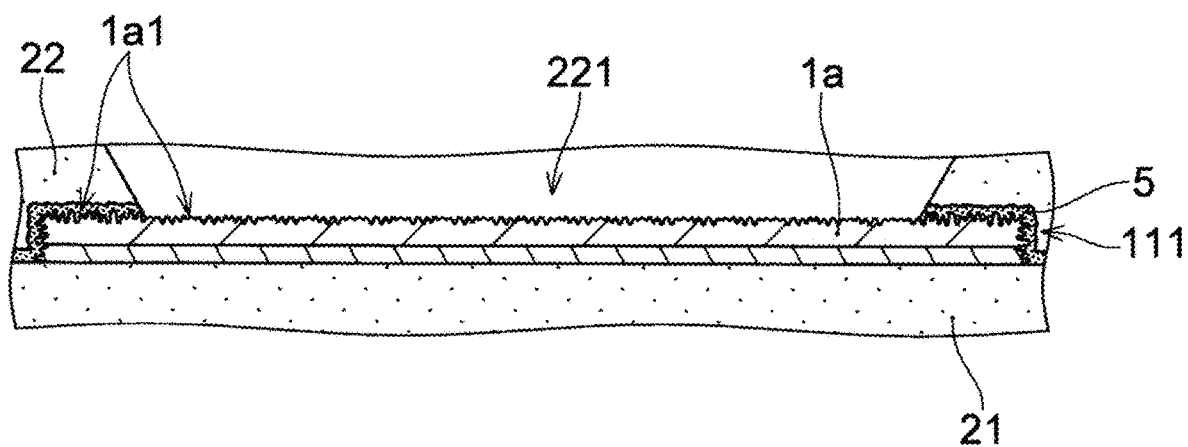
FIG. 6H is a cross-sectional view illustrating an example of a method for manufacturing a wiring substrate according to an embodiment of the present invention.

As illustrated in FIGS. 6G and 6H, the through hole 221 is formed that penetrates the insulating layer 22 and the insulating layer 23 and partially exposes the first conductor pad (1a). By forming the through hole 221, the component accommodating part (recess or cavity) (H) having the first conductor pad (1a) as the bottom surface is formed. FIG. 6H illustrates an enlarged view of a portion (VIH) in FIG. 6G. The through hole 221 is formed, for example, by irradiating laser over the entire formation region of the through hole 221 while performing pitch feeding. For example, $CO_2$ laser is irradiated. The first conductor pad (1a) can function as a laser stopper. The through hole 221 may also be formed using any other method such as drilling.

As illustrated in FIG. 6H, in the formation of the through hole 221, the coating film 5 formed on the surface (1a1) of the first conductor pad (1a) exposed in through hole 221 is removed, for example, by melting and vaporization. In this case, infiltration of a melting solution of the coating film 5 into the interface between the first conductor pad (1a) and the insulating layer 22 is prevented by the unevenness of the surface (1a1) of the first conductor pad (1a), which is roughened to have a relatively high surface roughness as described above.

After the formation of the through hole 221, preferably, a desmear treatment is performed in the same manner as the desmear treatment for the through holes (41a) (see FIG. 6F) described above. Infiltration of a processing liquid for the desmear treatment into the interface between the first conductor pad (1a) and the insulating layer 22 is prevented by the unevenness of the roughened surface (1a1) of the first conductor pad (1a). Further, preferably, a soft etching process is performed prior to the mounting of the component (E) (see FIG. 6I) in a subsequent process. By the soft etching process, as illustrated in FIG. 6H, the surface roughness of the portion of the surface (1a1) exposed in the through hole 221 is reduced to a surface roughness (third surface roughness) equal to or lower than the surface roughness (second surface roughness) of the portion of the surface (1a1) covered by the insulating layer 22.

Figure 6I:
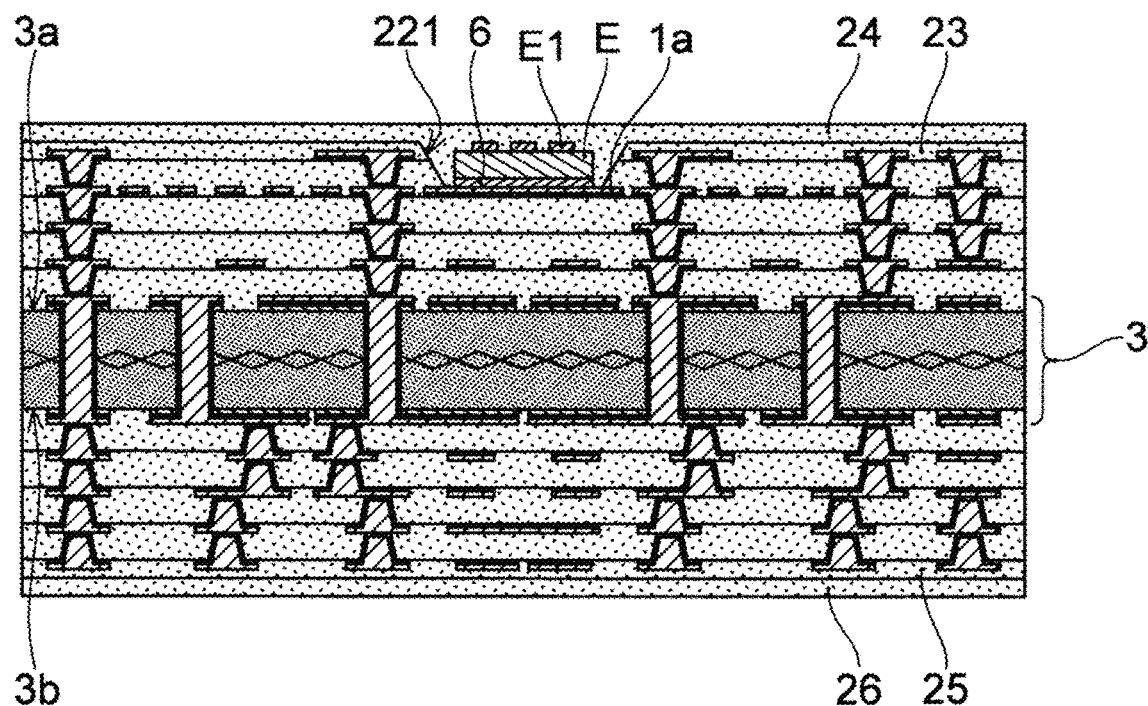
FIG. 6I is a cross-sectional view illustrating an example of a method for manufacturing a wiring substrate according to an embodiment of the present invention.

As illustrated in FIG. 6I, the component (E) is placed on the first conductor pad (1a). For example, a metal pellet of solder, copper, or the like, or a conductive or insulating paste, is supplied as the adhesive 6 onto the first conductor pad (1a), and further, the component (E) is placed thereon. The component (E) is bonded to the first conductor pad (1a) by the adhesive 6.

Then, the insulating layer 24 (sealing layer) that covers the component (E) is formed on the insulating layer 23. The insulating layer 26 is formed on the insulating layer 25 on the second surface (3b) side of the core substrate 3. The insulating layer 24 and the insulating layer 26 are formed using the same method as the method for forming the insulating layer 21 and the like described above. During the formation of the insulating layer 24, an epoxy resin or the like forming the insulating layer 24 is softened due to heating and pressing and flows into the through hole 221. Then, the through hole 221 is filled with the resin forming the insulating layer 24, and the component (E) is sealed in the through hole 221 by the resin forming the insulating layer 24.

Figure 6J:
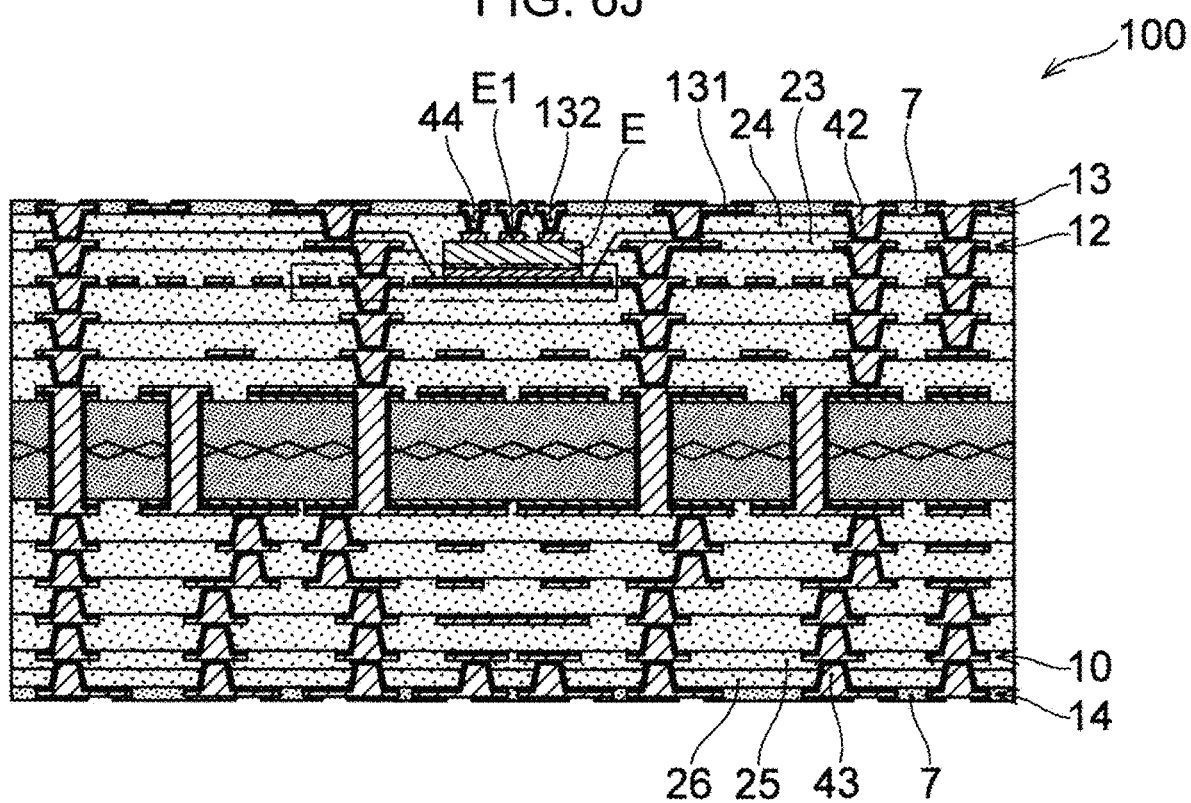
FIG. 6J is a cross-sectional view illustrating an example of a method for manufacturing a wiring substrate according to an embodiment of the present invention.

As illustrated in FIG. 6J, the conductor layers (13, 14) and the connection conductors (42-44) are formed. The connection pads (131, 132) used for connecting to external circuits are provided in the conductor layer 13. The conductor layer 13 is connected to the conductor layer 12 by the connection conductors 42 penetrating the insulating layer 24 and the insulating layer 23. The conductor layer 14 is connected to the conductor layer 10 by the connection conductors 43 penetrating the insulating layer 26 and the insulating layer 25. And, the connection pads 132 are connected to the electrodes (E1) of the component (E) by the connection conductors 44 penetrating the insulating layer 24 on the component (E).

The conductor layers (13, 14) and the connection conductors (42, 43) can be formed using the same method and material as described above for forming the conductor layer 11 and the connection conductors 40. In the formation of the connection conductors 44, through holes exposing the electrodes (E1) of the component (E) are formed, for example, by irradiating ultraviolet (UV) laser from the surface of the insulating layer 24 toward the electrodes (E1). The connection conductors 44 are formed by filling the through holes with a plating film along with the formation of the conductor layer 13.

After that, a solder resist 7 is formed on the conductor layer 13 and the insulating layer 24, and a solder resist 7 is also formed on the conductor layer 14 and the insulating layer 26. Openings exposing the connection pads (131, 132) are provided in the solder resist 7 on the conductor layer 13, and appropriate openings are also provided in the solder resist 7 on the conductor layer 14. The solder resist layers 7 and the openings thereof are formed by forming a resin layer containing a photosensitive epoxy resin or polyimide resin or the like, and performing exposure and development using a mask having appropriate opening patterns. Through the above processes, the wiring substrate 100 in the example of FIG. 1 is completed.

Figure 7:
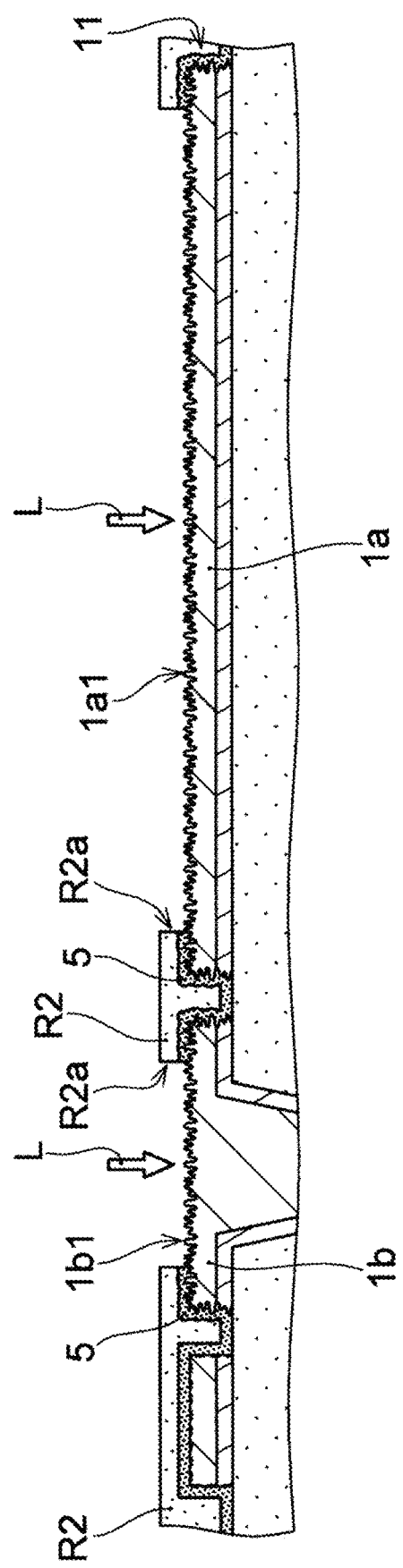
FIG. 7 is a cross-sectional view illustrating another example of a method for manufacturing a wiring substrate according to an embodiment of the present invention.

When the wiring substrate of the second embodiment illustrated in FIG. 4A is formed, for example, as illustrated in FIG. 7, after the formation of the coating film 5, a part of the coating film 5 on the surface (1a1) of the first conductor pads (1a) and on the surfaces (1b1) of the second conductor pads (1b) is removed prior to the formation of the insulating layer 22 (see FIG. 6E). Then, in the process described with reference to FIG. 6G, the through hole 221 is formed on the portion of the surface (1a1) of the first conductor pad (1a) that is not covered by the coating film 5 so as to be spaced apart from the coating film 5.

In the example of FIG. 7, a resist film (R2) is provided on portions of the coating film 5 to be left. Openings (R2a) are provided in the resist film (R2) in regions corresponding to portions of the coating film 5 to be removed. Then, the coating film 5 in the openings (R2a) is removed by irradiation of laser (L). The resist film (R2) is formed of, for example, a photosensitive material same as the resist film (R1) (see FIG. 6C) used for the roughening of the exposed surface of the conductor layer 11 described above. Examples of the laser used for removing the part of the coating film 5 include $CO_2$ laser, YAG laser, and the like. However, the laser used for removing the coating film 5 is not limited to these. Further, a method for removing a part of the coating film 5 is not limited to irradiation of laser. For example, a plasma treatment may be performed.

When the wiring substrate of the third embodiment illustrated in FIG. 4B is formed, in the formation process of the coating film 5 described with reference to FIG. 6D, the coating film 5 is provided such that the first conductor pad (1a) and the second conductor pads (1b) are entirely exposed. Further, the coating film 5 is provided so as to be spaced apart from the first conductor pad (1a) and the second conductor pads (1b). For example, in the forming process of the coating film 5 illustrated in FIG. 6D, a resist film (not illustrated in the drawings) that covers the first conductor pad (1a) and the second conductor pads (1b) is provided, and then, the coating film 5 is formed.

When the wiring substrate of the fourth embodiment illustrated in FIG. 4C is formed, in the roughening process of the conductor layer 11 described with reference to FIG. 6C, an unroughened region (non-roughened region) is left on each of the surface (1a1) of the first conductor pad (1a)

and the surfaces (1b1) of the second conductor pads (1b). For example, the resist film (R1) illustrated in FIG. 6C is also provided on the surface (1a1) of the first conductor pad (1a) and the surfaces (1b1) of the second conductor pads (1b). By leaving the non-roughened region, the second region (1ab) in FIG. 4C is provided. Then, in the formation process of the through hole 221 described with reference to FIG. 6G, the through hole 221 is formed so as to expose the non-roughened region. In particular, when the first conductor pad (1a) illustrated in FIGS. 4C and 5B is formed, the through hole 221 is formed so as to expose the entire non-roughened region (the second region (1ab) in FIG. 4C) in the through hole 221. Further, in the formation process of the through holes (41a) described with reference to FIG. 6F, the through holes (41a) are formed so as to expose the non-roughened regions.

The wiring substrate of the embodiment is not limited to those having the structures illustrated in the drawings and those having the structures, shapes, and materials exemplified herein. As described above, the wiring substrate of the embodiment can have any laminated structure. For example, the wiring substrate of the embodiment may be a coreless substrate that does not include a core substrate. The wiring substrate of the embodiment can have any number of conductor layers and any number of insulating layers. The conductor layer 11 can be a conductor layer of any layer, on an outer-layer side of which one or more insulating layers are laminated. The through hole 221 and the connection conductors (40-44) do not have to each have a tapered shape as in the example of FIG. 1 or the like. The conductor layers do not have to each include the electrolytic plating film layer (10b), but, for example, may each include only the metal coating film layer (10a) formed of an electroless plating film.

The method for manufacturing a wiring substrate of the embodiment is not limited the method described with reference to the drawings. For example, the conductor layers (10-14) may be formed using a full additive method. The insulating layers (20-26) can each be formed using a resin in any form without being limited to a film-like resin. In the method for manufacturing the wiring substrate of the embodiment, it is also possible that any process other than the processes described above is added, or some of the processes described above are omitted.

In the method described in Japanese Patent Application Laid-Open Publication No. 2018-172759, the chemical conversion coating film formed on the surface of the metal wiring layer may be dissolved by various treatments in subsequent processes. Therefore, in a printed wiring board manufactured using the method of Japanese Patent Application Laid-Open Publication No. 2018-172759, an unintended defect due to a dissolution solution of the chemical conversion coating film may occur, causing deterioration in quality of the printed wiring board.

A wiring substrate according to an embodiment of the present invention includes: a first insulating layer; a first conductor layer formed on the first insulating layer; a second insulating layer that covers the first insulating layer and the first conductor layer; and a coating film that is formed on a surface of the first conductor layer facing the second insulating layer and improves adhesion between the first conductor layer and the second insulating layer. The first conductor layer includes a first conductor pad, which includes a component mounting region, and a wiring pattern. The second insulating layer has a through hole that exposes the component mounting region. A mounting surface, which is a surface of the first conductor pad on the opposite side with respect to the first insulating layer, includes a first region, which is a portion covered by the second insulating layer. The first region is roughened and has a surface roughness higher than a first surface roughness of a surface of the wiring pattern facing the second insulating layer.

A method for manufacturing a wiring substrate according to another embodiment of the present invention includes: forming a first conductor layer that includes a first conductor pad and a wiring pattern on a first insulating layer; roughening an exposed surface of the first conductor layer; providing a coating film on a portion of or the entire exposed surface of the first conductor layer; forming a second insulating layer that covers the first conductor layer and the coating film; and forming a component accommodating part by forming a through hole that penetrates the second insulating layer and partially exposes the first conductor pad. In the roughening of the exposed surface of the first conductor layer, an exposed surface of the conductor pad is roughened without roughening an exposed surface of the wiring pattern.

According to an embodiment of the present invention, desired characteristics in the wiring pattern and adhesion between the conductor layer and the insulating layer can be ensured, and in addition, deterioration in quality of the wiring substrate due to peeling or the like between the conductor pad, which includes the component mounting region, and the insulating layer can be suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate, comprising:
a first insulating layer;
a conductor layer formed on the first insulating layer;
a second insulating layer formed on the first insulating layer such that the second insulating layer is covering the conductor layer; and
a coating film formed on a surface of the conductor layer such that the coating film is adhering the conductor layer and the second insulating layer,
wherein the conductor layer includes a conductor pad and a wiring pattern, the conductor pad of the conductor layer has a mounting surface including a first region and a component mounting region formed such that the second insulating layer has a through hole exposing the component mounting region and that the first region is covered by the second insulating layer, and the conductor pad of the conductor layer is formed such that the first region of the mounting surface has a surface roughness that is higher than a first surface roughness of a surface of the wiring pattern facing the second insulating layer.

2. The wiring substrate according to claim 1, wherein the conductor pad of the conductor layer is formed such that the first region of the mounting surface is covered partly or entirely by the coating film.

3. The wiring substrate according to claim 2, wherein the conductor pad of the conductor layer is formed such that the first region includes a portion that is in direct contact with the second insulating layer.

4. The wiring substrate according to claim 2, wherein the conductor pad of the conductor layer is formed such that the first region has an arithmetic mean roughness Ra of at least twice an arithmetic mean roughness Ra of the first surface roughness of the surface of the wiring pattern facing the second insulating layer.

5. The wiring substrate according to claim 2, wherein the coating film is formed such that the coating film is covering a portion of the first region of the conductor pad, and the second insulating layer is formed such that the through hole is formed on a portion of the first region that is not covered by the coating film and that the conductor pad is spaced apart from the coating film.

6. The wiring substrate according to claim 2, wherein the conductor pad of the conductor layer is formed such that the mounting surface includes a second region having a surface roughness substantially equal to or lower than the first surface roughness of the wiring pattern and being surrounded by the first region, and the second insulating layer is formed such that the through hole is exposing the second region of the conductor pad partially or entirely.

7. The wiring substrate according to claim 1, wherein the conductor pad of the conductor layer is formed such that the first region of the mounting surface is in direct contact with the second insulating layer.

8. The wiring substrate according to claim 1, wherein the conductor pad of the conductor layer is formed such that the first region of the mounting surface has an arithmetic mean roughness Ra of at least twice an arithmetic mean roughness Ra of the first surface roughness of the surface of the wiring pattern facing the second insulating layer.

9. The wiring substrate according to claim 1, wherein the coating film is formed such that the coating film is covering a portion of the first region of the conductor pad, and the second insulating layer is formed such that the through hole is formed on a portion of the first region that is not covered by the coating film and that the conductor pad is spaced apart from the coating film.

10. The wiring substrate according to claim 1, wherein the coating film is formed such that the coating film has an opening having an area larger than an area of the conductor pad and exposing the conductor pad entirely.

11. The wiring substrate according to claim 1, wherein the conductor pad of the conductor layer is formed such that the mounting surface includes a second region having a surface roughness substantially equal to or lower than the first surface roughness of the wiring pattern and being surrounded by the first region, and the second insulating layer is formed such that the through hole is exposing the second region of the conductor pad partially or entirely.

12. The wiring substrate according to claim 1, further comprising:
a second conductor layer formed on the second insulating layer; and
a connection conductor formed in the second insulating layer such that the connection conductor is connecting the conductor layer and the second conductor layer,
wherein the conductor layer includes a second conductor pad formed in contact with the connection conductor such that the second conductor pad has an upper surface on an opposite side with respect to the first insulating layer and that the upper surface includes a region roughened to have a surface roughness higher than the first surface roughness of the wiring pattern.

13. The wiring substrate according to claim 12, wherein the second conductor pad of the conductor layer is formed such that a portion of the upper surface of the second conductor pad is covered by the second insulating layer and has substantially a same surface roughness as the first region.

14. The wiring substrate according to claim 1, wherein the coating film is formed such that the coating film has an opening having an area larger than an area of the conductor pad and exposing the conductor pad entirely.

15. A method for manufacturing a wiring substrate, comprising:
forming a conductor layer including a conductor pad and a wiring pattern on a first insulating layer;
roughening an exposed surface of the conductor layer formed on the first insulating layer;
forming a coating film on at least portion of the exposed surface of the first conductor layer;
forming a second insulating layer such that the second insulating layer covers the first conductor layer and the coating film; and
forming a through hole in the second insulating layer such that the through hole penetrates through the second insulating layer and exposes a component accommodating part of the conductor pad,
wherein the roughening of the exposed surface of the conductor layer includes roughening the exposed surface of the conductor pad without roughening an exposed surface of the wiring pattern of the conductor layer, the conductor pad of the conductor layer has a mounting surface including a first region and a component mounting region formed such that the second insulating layer has the through hole exposing the component mounting region and that the first region is covered by the second insulating layer, and the conductor pad of the conductor layer is formed such that the first region of the mounting surface has a surface roughness that is higher than a first surface roughness of a surface of the wiring pattern facing the second insulating layer.

16. The method for manufacturing a wiring substrate according to claim 15, further comprising:
removing a portion of the coating film covering the conductor pad prior to the forming of the second insulating layer,
wherein the through hole is formed on a portion of the conductor pad that is not covered by the coating film such that the conductor pad is spaced apart from the coating film.

17. The method for manufacturing a wiring substrate according to claim 15, wherein the forming of the coating film includes forming the coating film such that the conductor pad is exposed entirely and spaced apart from the coating film.

18. The method for manufacturing a wiring substrate according to claim 15, wherein the roughening of the exposed surface of the conductor layer includes leaving a non-roughened region on a surface of the conductor pad on an opposite side with respect to the first insulating layer, and the forming of the through hole includes exposing the non-roughened region.

19. The method for manufacturing a wiring substrate according to claim 18, wherein the forming of the through hole includes exposing the non-roughened region entirely in the through hole.

20. The method for manufacturing a wiring substrate according to claim 15, further comprising:
forming a second conductor layer on the second insulating layer; and
forming a connection conductor in the second insulating layer such that the connection conductor penetrates through the second insulating layer and connects the conductor layer and the second conductor layer, wherein the conductor layer is formed such that the conductor includes a second conductor pad and that the connection conductor is connected to the second conductor pad, and the roughening of the exposed surface of the conductor layer includes roughening an exposed surface of the second conductor pad and the exposed surface of the conductor pad in a same process.

* * * * *